United States Patent

Watanabe et al.

[19]

[11] Patent Number: 5,897,330

[45] Date of Patent: Apr. 27, 1999

[54] METHOD OF MANUFACTURING THERMOELECTRIC POWER GENERATION UNIT

[75] Inventors: Shigeru Watanabe, Iruma; Yoichi Nagata, Tokorozawa, both of Japan

[73] Assignee: Citizen Watch Co., Ltd., Tokyo, Japan

[21] Appl. No.: 08/737,333

[22] PCT Filed: May 16, 1995

[86] PCT No.: PCT/JP95/00933

§ 371 Date: Nov. 14, 1996

§ 102(e) Date: Nov. 14, 1996

[87] PCT Pub. No.: WO95/31832

PCT Pub. Date: Nov. 23, 1995

[30] Foreign Application Priority Data

May 16, 1994 [JP] Japan ................................ 6-101392

[51] Int. Cl.⁶ .......................... H01L 21/56; H01L 21/60; H01L 21/70; H01L 35/02

[52] U.S. Cl. .................. 438/55; 438/68; 438/109; 438/126; 438/129; 438/458; 438/460

[58] Field of Search ................ 436/55, 68, 109, 436/126, 129, 458, 460, 973, FOR 371, FOR 379, FOR 386, FOR 485

[56] References Cited

U.S. PATENT DOCUMENTS

| | | |
|---|---|---|
| 3,780,425 | 12/1973 | Penn et al. . |
| 3,851,381 | 12/1974 | Alais et al. . |
| 3,930,303 | 1/1976 | Alais et al. . |
| 3,958,324 | 5/1976 | Alais et al. . |
| 4,072,864 | 2/1978 | Von Gutfeld . |
| 4,149,025 | 4/1979 | Niculescu . |
| 4,922,822 | 5/1990 | Bierschenk et al. . |
| 4,971,632 | 11/1990 | Rowe . |
| 5,209,786 | 5/1993 | Rolfe et al. . |
| 5,279,991 | 1/1994 | Minahan et al. . |
| 5,432,418 | 7/1995 | Minahan . |

FOREIGN PATENT DOCUMENTS

| | | |
|---|---|---|
| 63-70462 | 3/1988 | Japan . |
| 63-84171 | 4/1988 | Japan . |
| 2-30190 | 1/1990 | Japan . |
| 6-338636 | 12/1994 | Japan . |

*Primary Examiner*—David Graybill
*Attorney, Agent, or Firm*—Armstrong, Westerman, Hattori, McLeland & Naughton

[57] ABSTRACT

A thermoelectric power generation unit comprises a plurality of dissimilar thermoelectric structures (20, 21) laid in alternating layers. Adjacent thermoelectric bodies incorporated in each of the thermoelectric structures are connected together in series. Respective thermoelectric structures are fabricated by the steps of forming a stripe-shaped pattern on a substrate (10) using a photosensitive resin (12), forming a polymer film on the underside of the substrate, forming first thermoelectric bodies (15) and second thermoelectric bodies (17) by plating on an electrode film (11) inside openings of the photosensitive resin, coating the first thermoelectric bodies (15) and second thermoelectric bodies (17) with a thermosetting resin (16), dissolving the substrate (10) and electrode film (11) thereafter.

14 Claims, 19 Drawing Sheets

METHOD OF MANUFACTURING THERMOELECTRIC POWER GENERATION UNIT

TECHNICAL FIELD

The present invention relates to a method of manufacturing a thermoelectric power generation unit fabricated by electrically connecting in series a plurality of thermocouples as thermoelectric power generation elements, each fabricated by bonding together dissimilar semiconductors.

BACKGROUND TECHNOLOGY

In a thermocouple, a voltage is developed when different temperatures are applied to the opposite ends thereof. Thermoelectric power generation makes use of the voltage as electric energy.

Thermal power generation has attracted much attention lately as an effective means of converting thermal energy directly into electric energy including the utilization of waste heat.

In particular, a thermoelectric power generation unit used for generation of thermoelectric power has attracted much attention because of its potential for application to micro-sized portable electronic equipment, for example, a wrist watch, since it has advantages over other types of power generators in that it is more adaptable to miniaturization owing to its simple structure composed of a plurality of thermoelectric power generation elements, namely, thermocouples, connected together in series, and further it will pose no problem of battery depletion or leakage of the electrolyte in a battery unlike the case of a redox battery.

FIG. 46 is a perspective view showing an example of a structure of a conventional thermoelectric power generation unit. This thermoelectric power generation unit has a laminated structure as a whole, and comprises a plurality of thermocouples 100 consisting of P type thermoelectric material 101 and N type thermoelectric material 102; a large number of the thermocouples serving as thermoelectric power generation elements are disposed in a predetermined manner and electrically connected in series.

A hot junction 104 and a cold junction 105 of respective thermocouples 100 are disposed on the upper surface and the underside surface, respectively, of the thermoelectric power generation unit with the laminated structure so that power is generated by a difference in temperature between both surfaces.

Thermoelectric power is generated by utilizing the so called "Seebeck Effect" wherein if two dissimilar metals are connected together at opposite ends, and a difference in temperature is maintained between two junctions, a thermoelectric e. m. f. is generated between the two junctions.

Such a thermoelectric power generation unit for generation of thermoelectric power as described above is normally manufactured by the following method.

Firstly, pulverized alloy particles are sintered to form a block of process material; P type and N type thermoelectric semiconductor materials in block form are prepared by what is called the "sintering method".

Then, each block thus formed of respective thermoelectric materials is cut and broken into chips in the shape of a rectangular parallelepiped by a dicing saw or the like. The chips with the rectangular parallelepiped shape are arranged in a matrix fashion as shown in FIG. 46 such that a P type thermoelectric material 101 and an N type thermoelectric material 102 are alternately disposed.

Subsequently, a thermoelectric power generation unit comprising a plurality of thermocouples connected in series is fabricated by connecting the opposite ends (at the hot junction 104 and the cold junction 105, respectively) of adjacent chips with a conducting member such as a metal plate or the like, such connection being made mainly by soldering.

Typically, the conventional thermoelectric power generation unit fabricated by the method stated above is of a shape several tens cm square or larger and comprises scores of thermocouples.

The output of a conventional thermocouple composed of a Bi—Te based material, which is believed to have the highest performance among all the thermoelectric materials in practical use, is on the order of 400 $\mu$V/°C. per thermocouple.

A wrist watch, representative of portable electronic equipment, is normally used in an environment at around room temperature, and consequently, a large difference in temperature between any parts inside a wrist watch can not be anticipated; the magnitude of temperature difference therein will be around 2° C. at most.

Due to such small difference in temperature inside a wrist watch, as many as 2,000 thermocouples composed by a Bi—Te based material will be required to generate a voltage needed to drive a wrist watch, namely 1.5V or higher.

This may not pose any problem if a thermoelectric power generation unit can be enlarged in dimensions. However, it is very hard to integrate as many as 2000 thermocouples in a space 1 cm square, substantially equivalent to the size of a button sized cell. The size of a thermoelectric power generation unit is important particularly when it is to be used as a power supply source of a wrist watch and other micro-sized electronic equipment.

Simply stated, the miniaturization of thermoelectric power generation units may be achieved only if a sintered body of thermoelectric materials can be cut into minute pieces by mechanical working as stated in the foregoing.

However, working on micro-sized elements has naturally its limitations and owing to the very fragile nature of most thermoelectric materials, caution needs to be exercised not only to a cutting process but also to a handling thereof after the cutting process, inevitably resulting in a lower production yield.

The minimum size of a material that can be handled in the conventional method of manufacturing by mechanical working is considered to be about 1 mm square, and even if a thermoelectric power generation unit is packaged into a space 1 cm square, the maximum number of thermoelectric power generation elements, namely thermocouples, incorporated therein is estimated at around 50 couples only.

There is another conceivable method of manufacturing a thermoelectric power generation unit wherein a thermoelectric material in a thin film form is formed by the vacuum deposition process, small-sized thermocouples are fabricated by preparing the micro-sized thermoelectric material in a thin film form through the etching process, and the thermocouples thus fabricated are connected in series, completing a thermoelectric power generation unit. Certainly, manufacturing small-sized thermocouples will become easier with this method.

However, the film formed by the vacuum deposition process is around 1 $\mu$m in thickness, which is too thin to compose thermocouples for use as thermoelectric power generation elements, and when as many as 2000 of such thermocouples are in place, the internal impedance thereof will become too high, posing the risk of the thermocouples being unable to output a current strength required of the thermoelectric power generation elements.

Therefore, thermocouples fabricated with films formed by the vacuum deposition process are unsuitable for use as the thermoelectric power generation elements.

Still, a further process proposed for forming the thermoelectric power generation elements is a so-called thick film process wherein a Bi—Te based alloy in a pasty state is applied and then sintered to form a film significantly thicker than the thin film formed by the vacuum deposition process.

The method of manufacturing a thermoelectric power generation element by the thick film process is disclosed, for example, in Japanese Patent Laid Open, JP. A S63-70462.

By the thick film process disclosed in the JP. A S63-70462 fine patterning is feasible by means of screen printing, and furthermore, a film as thick as 10 μm or more can be formed. For this reason, the thick film process is more suitable for forming thermoelectric power generation elements with low internal impedance than the method of forming a thin film by the vacuum deposition process.

However, the thick film process is very complex since it requires preprocessing steps comprising: melting first process materials such as Bi, Te, Sb, Se or the like, making an ingot of alloy from molten metals mixed, and crushing the ingot to make paste from pulverized alloy, without allowing the process materials to be just mixed in their raw state and applied.

Furthermore, this process poses risks of the process materials being contaminated by impurities in one of the preprocessing steps of making the pasty material, uneven distribution of chemical composition occurring in the material prepared as above due to failure in making a uniform solid solution, and cracks occurring in the course of sintering.

With this process, patterning by screen printing is possible but high precision fabrication of micro-sized thermoelectric power generation elements is hard to achieve. For the reasons stated in the foregoing the thick film process is not good enough to provide thermoelectric power generation elements having satisfactory characteristics, and therefore, not the most suitable method for manufacturing micro-sized thermoelectric power generation units.

As is clear from the foregoing description, by means of either the conventional mechanical working method or the manufacturing method through etching the film formed by the conventional vacuum deposition process, it is hard to manufacture a thermoelectric power generation unit by integrating a number of thermocouples as the thermoelectric power generation elements in a minuscule region, and a manufacturing method for a micro-sized thermoelectric power generation unit with a sufficient output capacity has not been available.

On the other hand, the thick film process as stated above is not fully satisfactory in respect of the complex nature of the process and the product characteristics.

Therefore, it is an object of the present invention to provide a method of manufacturing with high precision and with ease a micro-sized thermoelectric power generation unit having a sufficient output capacity as a generator and with a capability of high precision patterning as well, solving problems encountered by the conventional methods for manufacturing a thermoelectric power generation unit.

DISCLOSURE OF THE INVENTION

The aforesaid object of the present invention is attained by adopting various methods of manufacturing a thermoelectric power generation unit as stated hereafter.

The first method of manufacturing a thermoelectric power generation unit according to the invention comprises the following processes:

a process of forming the first thermoelectric structure comprising the steps of forming an electrode film made of a metallic material on a substrate, providing a pattern in the shape of stripes on the electrode film using a photosensitive resin, forming first thermoelectric bodies consisting of a first thermoelectric material by means of plating within openings provided in the photosensitive resin, using the electrode film, coating the photosensitive resin and the first thermoelectric bodies with a thermosetting resin, and dissolving and removing the substrate and the electrode film;

a process of forming a second thermoelectric structure comprising the steps of forming an electrode film consisting of a metallic material on a substrate other than the aforesaid substrate, providing a pattern in the shape of stripes on the electrode film using a photosensitive resin, forming second thermoelectric bodies consisting of a second thermoelectric material by means of plating within openings provided in the photosensitive resin using the electrode film, coating the photosensitive resin and the second thermoelectric body with a thermosetting resin, and dissolving and removing the substrate and the electrode film; and a process of forming a plurality of thermocouples connected in series as a thermoelectric power generation element comprising the steps of bonding together a plurality of the first thermoelectric structures and the second thermoelectric structures, which are laid in alternating layers cutting the first and second thermoelectric structures in a predetermined length, and connecting the surface at the cut end of each of the first thermoelectric bodies to the surface at the cut end of one of the second thermoelectric bodies, adjacent to the former, alternately with wiring electrodes.

The second method of manufacturing a thermoelectric power generation unit according to the invention is substantially the same as the first method stated above except that in the process of forming the first and second thermoelectric structures, the step of coating the photosensitive resin, and the first thermoelectric bodies or the second thermoelectric bodies with the thermosetting resin is substituted by a step of adhesively bonding a heat insulating sheet on the photosensitive resin and the first thermoelectric bodies or second thermoelectric bodies.

The third method of manufacturing a thermoelectric power generation unit according to the invention comprises the following processes:

a process comprising the steps of forming an electrode film consisting of a metallic material on a substrate, providing a pattern in the shape of stripes on the electrode film using a photosensitive resin, and forming first thermoelectric bodies consisting of a first thermoelectric material by means of plating within openings provided in the photosensitive resin using the electrode film;

a process comprising the steps of forming an electrode film consisting of a metallic material on a substrate other than aforesaid substrate, providing a pattern in the shape of stripes on the electrode film using a photosensitive resin, and forming second thermoelectric bodies consisting of a second thermoelectric material by means of plating within openings provided in the photosensitive resin using the electrode film;

a process comprising the steps of bonding the surface of the first thermoelectric bodies formed on one of the substrates to that of the second thermoelectric bodies formed on the other of the substrates with a heat insulating sheet interposed in-between, and forming a composite thermoelectric structure by dissolving and removing both of the substrates and respective electrode films; and a process comprising the steps of bonding together a plurality of the composite thermoelectric structures laid in layers, cutting the plurality of the composite thermoelectric structures in a predetermined length, forming a plurality of thermocouples connected in series as a thermoelectric power generation element by connecting the surface at the cut end of each of the first thermoelectric bodies to the surface at the cut end of one of the second thermoelectric bodies, adjacent to the former, alternately with wiring electrodes.

The fourth method of manufacturing a thermoelectric power generation unit according to the invention comprises the following processes:

a process of forming a first thermoelectric structure comprising the steps of providing a pattern in the form of stripes on an electrically conductive substrate using a photosensitive resin, forming first thermoelectric bodies consisting of a first thermoelectric material by means of plating within openings provided in the photosensitive resin using the substrate as an electrode, coating the photosensitive resin and the first thermoelectric bodies with a thermosetting resin, and dissolving and removing the substrate;

a process of forming a second thermoelectric structure comprising the steps of providing a pattern in the shape of stripes on an electrically conductive substrate other than the aforesaid substrate using a photosensitive resin, forming second thermoelectric bodies consisting of a second thermoelectric material by means of plating within openings provided in the photosensitive resin using the substrate as an electrode, coating the photosensitive resin and the second thermoelectric bodies with a thermosetting resin, and dissolving and removing the substrate; and a process comprising the steps of bonding a plurality of the first thermoelectric structures to a plurality of the second thermoelectric structures laid in layers, cutting the plurality of the first and second thermoelectric structures bonded together in a predetermined length, and forming a plurality of thermocouples connected in series as a thermoelectric power generation element by connecting the surface at the cut end of each of the first thermoelectric bodies with that of one of the second thermoelectric bodies, adjacent to the former, alternately with wiring electrodes.

The fifth method of manufacturing a thermoelectric power generation unit according to the invention comprises substantially the same processes as those for the fourth method stated above except that in the process of forming the first and second thermoelectric structures, the step of coating the photosensitive resin, and the first thermoelectric body or the second thermoelectric body with the thermosetting resin is substituted by the step of bonding a heat insulating sheet on the photosensitive resin, and the first thermoelectric body or the second thermoelectric body.

The sixth method of manufacturing a thermoelectric power generation unit according to the invention comprises the following processes:

a process comprising the steps of providing a pattern in the shape of stripes on an electrically conductive substrate using a photosensitive resin, and forming first thermoelectric bodies consisting of a first thermoelectric material by means of plating within openings provided in the photosensitive resin using the substrate as an electrode;

a process comprising the steps of providing a pattern in the shape of stripes on an electrically conductive substrate other than the aforesaid substrate using a photosensitive resin, and forming second thermoelectric bodies consisting of a second thermoelectric material by means of plating within openings provided in the photosensitive resin using the substrate as an electrode;

a process comprising the steps of bonding the surface of the first thermoelectric bodies formed on the substrate to the surface of the second thermoelectric bodies formed on the other substrate with a heat insulating sheet interposed in-between, and forming a composite thermoelectric structure by a step of dissolving and removing both of aforesaid substrates; and a process comprising the steps of bonding together a plurality of the composite thermoelectric structures, laid in layers, cutting the composite thermoelectric structures bonded together in a predetermined length, and forming a plurality of thermocouples connected in series as a thermoelectric power generation element by connecting the surface at the cut end of each of the first thermoelectric bodies to the surface at the cut end of one of the second thermoelectric bodies, adjacent to the former, alternately by wiring electrodes.

The seventh method of manufacturing a thermoelectric power generation unit according to the invention comprises the following processes:

a process of forming a thermoelectric structure comprising the steps of forming a metallic film on a substrate whose surface or whole body has insulation properties, forming the metallic film by etching into a first electrode film and a second electrode film formed in the shape of teeth of two combs facing each other, each tooth being alternately interposed between adjacent teeth, forming a pattern in the shape of stripes on a photosensitive resin in the gap area between the first electrode film and the second electrode film, each in the shape of teeth of a comb, forming first thermoelectric bodies consisting of a first thermoelectric material by plating on the first electrode film inside openings of the photosensitive resin forming second thermoelectric bodies consisting of a second thermoelectric material by plating on the second electrode film inside openings of the photosensitive resin, coating the photosensitive resin, the first thermoelectric bodies, and the second thermoelectric bodies with a thermosetting resin, and dissolving and removing the substrate, first electrode film, and second electrode film; and a process of forming a plurality of thermocouples connected in series as thermoelectric power generation elements comprising the steps of stacking and bonding together a plurality of the thermoelectric structures, cutting the plurality of the thermoelectric structures at both ends in a predetermined length, and connecting alternately the surface at the cut end of each of the first thermoelectric bodies to that of one of the second thermoelectric bodies, adjacent to the former, by wiring electrodes.

The eighth method of manufacturing a thermoelectric power generation unit according to the invention comprises substantially the same processes as those for the seventh method except that in the process of forming the thermoelectric structure, a process of adhesively bonding a heat insulating sheet on the photosensitive resin, first thermoelectric bodies, and second thermoelectric bodies is substituted for the process of coating the photosensitive resin, first thermoelectric bodies, and second thermoelectric bodies with the thermosetting resin.

The ninth method of manufacturing a thermoelectric power generation unit, according to the invention, comprises substantially the same processes as those for the seventh or eighth method to the extent that in the process of forming a thermoelectric structure according to the aforesaid seventh or eighth method, first thermoelectric bodies and second thermoelectric bodies are formed by plating on the substrate inside the openings of the photosensitive resin.

However, this method comprises a process of bonding together two substrates on which the first thermoelectric bodies and second thermoelectric bodies are formed, with a heat insulating sheet interposed in-between, and a process of dissolving and removing the respective substrates, first electrode films, and second electrode films, forming a composite thermoelectric structure.

Subsequently, a plurality of thermocouples connected in series as a thermoelectric power generation element are formed by stacking, and bonding together a plurality of the composite thermoelectric structures, which are then cut in a predetermined length, and by connecting the surface at the cut end of each of the first thermoelectric bodies to that of one of the second thermoelectric bodies, adjacent to the former, alternately with wiring electrodes.

The tenth method of manufacturing a thermoelectric power generation unit according to the invention comprises substantially the same processes as those for the seventh method up to the process of coating the photosensitive resin, first thermoelectric bodies, and second thermoelectric bodies with the thermosetting resin, in the process of forming a thermoelectric structure according to the seventh method.

Thereafter, by applying a process of forming another metallic film on an entire plating initiation surface after dissolving and removing the substrates, first electrode films, and second electrode films, and a process of forming thermocouples in a row as a thermoelectric element after connecting each of the first thermoelectric bodies to one of the second thermoelectric bodies, adjacent to the former, alternately with wiring electrodes formed by patterning on the metallic film by the etching method, a thermoelectric structure is formed.

After stacking and bonding together a plurality of the thermoelectric structures, all the thermocouples are connected in series by connecting together adjacent thermocouples in respective rows, end to end.

The eleventh method of manufacturing a thermoelectric power generation unit, according to the invention, comprises substantially the same processes as those for the tenth method except that in the process of forming the thermoelectric structure, a process of adhesively bonding a heat insulating sheet on the photosensitive resin, first thermoelectric bodies, and second thermoelectric bodies is substituted for the process of coating the photosensitive resin, first thermoelectric bodies, and second thermoelectric bodies with the thermosetting resin.

The twelfth method of manufacturing a thermoelectric power generation unit comprises the following processes:

a process of forming a thermoelectric structure comprising the steps of forming a metallic film on a substrate whose surface or entire body has insulation properties, shaping by the etching method the metallic film into a first electrode film and a second electrode film in the shape of teeth of two combs facing each other, each tooth interposed between adjacent teeth, patterning in the shape of stripes on a photosensitive resin in gaps between the respective teeth of the first electrode film and second electrode film, forming first thermoelectric bodies consisting of a first thermoelectric material by plating on the first electrode film inside openings of the photosensitive resin, forming second thermoelectric bodies consisting of a second thermoelectric material by plating on the second electrode film inside openings of the photosensitive resin, bonding together two substrates, on which the first thermoelectric bodies and second thermoelectric bodies are formed, by means of aforesaid processes, with a heat insulating sheet interposed in-between, forming another metallic film on a plating initiation surface after dissolving and removing the substrates, first thermoelectric bodies, and second thermoelectric bodies, and forming thermocouples in a row as a thermoelectric element after connecting each of the first thermoelectric bodies to one of the second thermoelectric bodies, adjacent to the former, alternately, with wiring electrodes formed by patterning on the metallic film by the etching method; and a process of connecting all the thermocouples in series comprising the steps of stacking and bonding together a plurality of thermoelectric structures, and connecting together adjacent thermocouples in respective rows, end to end.

The thirteenth method of manufacturing a thermoelectric power generation unit comprises the following processes:

a process of forming a first thermoelectric structure comprising the steps of forming an electrode film made of a metallic material on a substrate, forming a photosensitive resin having a first pattern in the shape of stripes on the electrode film, and forming first thermoelectric bodies consisting of a first thermoelectric material by plating on the electrode film inside openings of the photosensitive resin such that the thickness of the first thermoelectric bodies is less than that of the photosensitive resin;

a process of forming a second thermoelectric structure comprising the steps of forming an electrode film made of a metallic material on a substrate other than aforesaid substrate, forming on the electrode film a photosensitive resin having a second pattern in the shape of stripes, formed at the same pitch as that of the first pattern in the shape of stripes and provided with unopened surface areas, each narrower than the width of each of the openings in the first pattern in the shape of stripes, and openings, each wider than the width of each of the unopened surface areas in the first pattern in the shape of stripes, and forming second thermoelectric bodies consisting of a second thermoelectric material by plating on the electrode film inside openings of the photosensitive resin such that the thickness of the second thermoelectric bodies is less than that of the photosensitive resin;

a process of forming a composite thermoelectric structure comprising the steps of bonding together the first thermoelectric structure and second thermoelectric structure formed by means of aforesaid processes after fitting the openings in the photosensitive resin of one of the thermoelectric structures into the unopened surface areas in the photosensitive resin of the other, cutting the first thermoelectric structure and second thermoelectric structure, bonded together as above, in a predetermined size, dissolving and removing the respective substrates and electrode films, and forming thermocouples in a row as a thermoelectric element by connecting the surface at the cut end of each of the first thermoelectric bodies to the surface at the cut end of one of the second thermoelectric bodies, adjacent to the former, alternately, with wiring electrodes; and a process of connecting all thermocouples in series comprising the steps of stacking and bonding together a plurality of the composite thermoelectric structures with insulators interpose in-between, and connecting together adjacent thermoelectric bodies on the edge of the respective composite thermoelectric structures with element terminal wirings.

The fourteenth method of manufacturing a thermoelectric power generation unit comprises the following processes:

a process of forming a first thermoelectric structure comprising the steps of forming a photosensitive resin having a first pattern in the shape of stripes on an electrode film formed on an electrically conductive substrate, and forming first thermoelectric bodies consisting of a first thermoelectric material by plating on the electrode film inside openings of the photosensitive resin such that the thickness of the first thermoelectric bodies is less than that of the photosensitive resin;

a process of forming a second thermoelectric structure comprising the steps of forming an electrode film made of a metallic material on a substrate other than aforesaid substrate, forming on the electrode film a photosensitive resin having a second pattern in the shape of stripes, formed at the same pitch as that of the first pattern in the shape of stripes and provided with unopened surface areas, each narrower than the width of each of the openings in the first pattern in the shape of stripes, and openings, each wider than the width of each of the unopened surface areas in the first pattern in the shape of stripes, and forming second thermoelectric bodies consisting of a second thermoelectric material by plating on the electrode film inside openings of the photosensitive resin such that the thickness of the second thermoelectric bodies is less than that of the photosensitive resin;

a process of forming a composite thermoelectric structure comprising the steps of bonding together the first thermoelectric structure and second thermoelectric structure formed by means of aforesaid processes after fitting the openings in the photosensitive resin of one of the thermoelectric structures into the unopened surface areas in the photosensitive resin of the other, cutting the first thermoelectric structure and second thermoelectric structure, bonded together as above, in a predetermined size, dissolving and removing the respective substrates and electrode films, and forming thermocouples in a row as a thermoelectric element by connecting the surface at the cut end of each of the first thermoelectric bodies to the surface at the cut end of one of the second thermoelectric bodies, adjacent to the former, alternately, with wiring electrodes; and a process of connecting all thermocouples in series comprising the steps of stacking and bonding together a plurality of the composite thermoelectric structures with insulators interpose in-between, and connecting together adjacent thermoelectric bodies on the edge of respective composite thermoelectric structures with element terminal wirings.

With reference to the thirteenth and fourteenth methods of manufacturing a thermoelectric power generation unit, it is desirable that the width of each of the openings in the first pattern in the shape of stripes is wider than that of each of the unopened surface areas therein, and the second pattern in the shape of stripes is identical with the first pattern in the shape of stripes.

Also, in the respective methods of manufacturing a thermoelectric power generation unit according to the invention as described in the foregoing, use of a photosensitive dry film consisting of acrylic resin or a photosensitive polyimide resin is recommendable for a photosensitive resin with which a pattern in the shape of stripes is formed on a substrate or an electrode film formed thereon.

In the aforesaid methods of manufacturing a thermoelectric power generation unit, patterning is provided with a photosensitive resin, and thermoelectric bodies are formed by a plating process inside openings of the photosensitive resin. Accordingly, a thermoelectric power generation element (thermocouples) having a thickness of several tens $\mu$m can be formed with high precision.

Further, since the thermoelectric bodies are formed by the plating process, the thermoelectric bodies with thickness in the range from 10 $\mu$m to about 100 $\mu$m can be formed, and the chemical composition of the thermoelectric bodies can be controlled with ease by adjusting the chemical composition of a plating bath and an applied voltage.

The methods of manufacturing a thermoelectric power generation unit according to the invention comprise the photolithography process using a photosensitive resin, plating process, vacuum deposition process, and etching process. Therefore, a plurality of the elements can be formed on a batch basis simultaneously, enabling the integration density of the thermocouples, namely, thermoelectric power generation elements to jump up dramatically from the conventional level. As a result, a micro-sized thermoelectric power generation unit capable of generating a high output even at a small difference in temperature can be manufactured with ease.

In the method of forming a thermoelectric power generation element, respective thermoelectric structures have thermoelectric bodies formed by plating in openings of a photosensitive resin having a pattern in the shape of stripes. Accordingly, slippage, if any, in the cross sectional position of the thermoelectric bodies is minimized by stacking a plurality of thermoelectric structures incorporating thermoelectric bodies consisting of different thermoelectric materials, such that the unopened surface areas of the photosensitive resin of one thermoelectric structure fit snugly onto the openings (plated portion) of the photosensitive resin of another thermoelectric structure.

As a result, the spacing between dissimilar thermoelectric materials falls within a predetermined range automatically, making matching of patterns easier when bonding together thermoelectric structures; when wiring between the thermoelectric bodies is provided by a vacuum deposition process or photolithographic techniques, the work can be performed with ease by preparing a mask matching the predetermined spacing.

BRIEF DESCRIPTION OF DRAWINGS

FIGS. 1 to 3 and FIG. 7 illustrate a second and third embodiments, FIGS. 4 and 5 illustrate the second embodiment as above, FIG. 8 illustrates the second, fourth and fifth embodiments according to the invention.

FIGS. 11 and 12 illustrate a sixth embodiment. FIG. 13 illustrates the sixth and ninth embodiments.

FIGS. 14 and 15 illustrate the fifth and sixth embodiments, FIGS. 17 and 18 illustrate the fifth embodiment.

FIGS. 21 to 23 illustrate the eighth to twelfth embodiments, FIG. 25 illustrates a tenth embodiment, FIGS. 26 to 28 illustrate the eighth embodiment.

FIG. 30 illustrates the twelfth embodiment.

FIG. 46 is a perspective view showing one form of a thermoelectric power generation unit manufactured by the conventional method.

BEST MODE FOR CARRYING OUT THE INVENTION

The method of manufacturing a thermoelectric power generation unit according to the invention will be described in more detail by the following description of the examples of preferred embodiments with reference to the accompanying drawings.

First Embodiment

Referring to FIGS. 1 to 8, the method of manufacturing a thermoelectric power generation unit according to the invention by the first embodiment is described hereafter.

Figure 1:
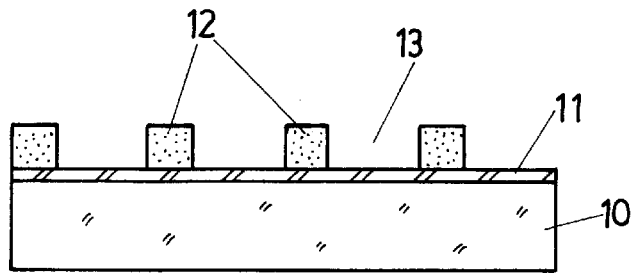
FIGS. 1 to 8 illustrate a first embodiment embodying the method of manufacturing a thermoelectric power generation unit according to the invention. Also.

Now referring to FIG. 1, a substrate 10 is made of a copper sheet, and an electrode film 11 is formed on the substrate 10 by a vacuum deposition process using titanium (Ti). The electrode film 11 is 500 nm in thickness.

A titanium film of the electrode film can protect a copper sheet of the substrate 10 from being attacked by a plating solution during a plating treatment described hereafter.

Subsequently, a photosensitive resin film 12 is formed on the electrode film 11. The photosensitive film 12 is formed by a roll coater using a photosensitive dry film 50 $\mu$m in thickness.

Figure 7:
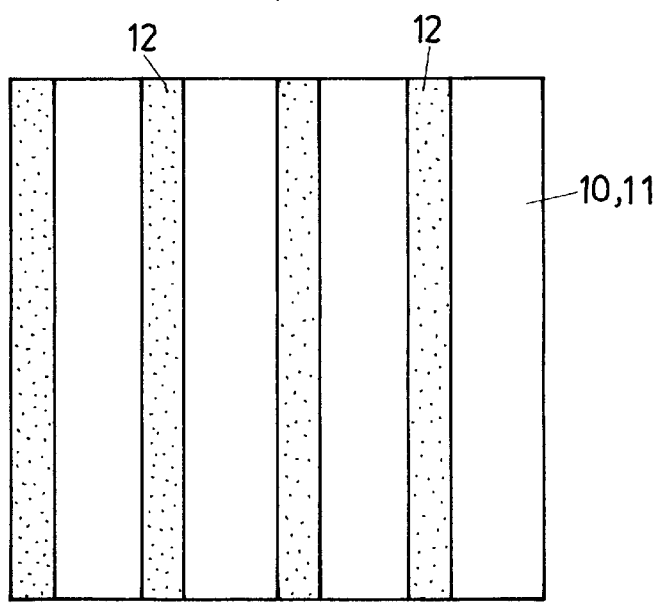

Then, as shown in FIG. 1, a pattern in the form of stripes is provided in the photosensitive resin 12 by means of a photolithographic techniques consisting of light exposure treatment for striking objects with light through a photo mask and development treatment for dissolving and removing unexposed portions only. FIG. 7 is a plan view showing the shape of the pattern provided in the photosensitive resin 12.

After the photosensitive resin 12 is formed, a Teflon-based polymer film is formed on the entire surface of the underside of the substrate 10 by a spin coating process (not shown in FIG. 1).

The polymer film made of a Teflon-based material which is formed on the underside surface of the substrate 10 is effective in preventing a metallic deposit from being formed on the substrate 10 in the course of a plating process described hereafter.

Figure 2:
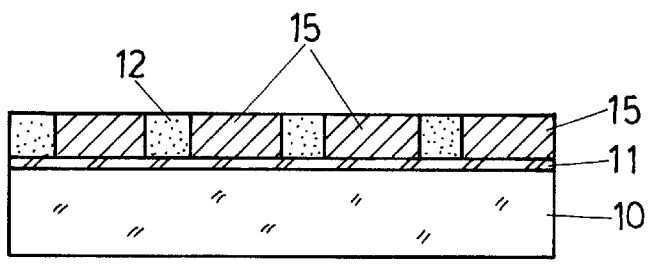

In the next step, first thermoelectric bodies 15 made of a first thermoelectric material are formed by a plating process in openings 13 provided in the photosensitive resin 12 on the substrate 10 as shown in FIG. 2.

A Bi—Te—Se alloy which is an N type semiconductor is used as the material for the first thermoelectric bodies 15.

A plating electrolyte used for forming the first thermoelectric bodies 15 is a nitric acid solution containing $Bi(NO_3)_3$, $TeO_2$, and $SeO_2$. The Bi—Te—Se alloy is deposited on the electrode film 11 inside the openings 13 of the photosensitive resin 12 by applying 1V between the electrode film 11 serving as a cathode and a platinum (Pt) electrode serving as an anode.

By plating as stated above, the first thermoelectric bodies 15 are formed on the electrode film 11 only in the regions within the openings 13 surrounded by the photosensitive resin 12 because the underside surface of the substrate 10 is protected by the polymer film.

In the plating process for forming the first thermoelectric bodies 15, the amount of metallic deposit is determined according to the quantity of electric charge which can be calculated on the basis of electric current consumed during electrolysis. For this reason, the thickness of the first thermoelectric bodies 15 can be easily controlled to be within a required range by measuring the quantity of electric charge.

The quantity of reaction electric charge is set such that the first thermoelectric bodies 15 will have the same thickness as that of the photosensitive resin 12, on which patterning is provided, as shown in FIG. 2, namely, 50 $\mu$m.

Further, the chemical composition of the alloy can be altered by varying the ion concentrations of Bi, Te, and Se contained in the plating electrolyte, and the selection of the material for the first thermoelectric bodies 15, having a required output voltage and resistance value, becomes possible by varying the set conditions for ion concentration of the aforesaid metals.

After the plating of the first thermoelectric bodies 15 is completed, the polymer film is exfoliated using toluene and removed from the underside surface of the substrate 10, whereupon the first thermoelectric bodies 15 formed on the substrate 10 are heat treated in a nitrogen atmosphere at 350° C. for one hour.

The heat treatment in a nitrogen atmosphere is applied for homogenizing the composition of the alloy composing the first thermoelectric bodies 15 so that the output of the thermoelectric power generation elements is enhanced.

Figure 3:
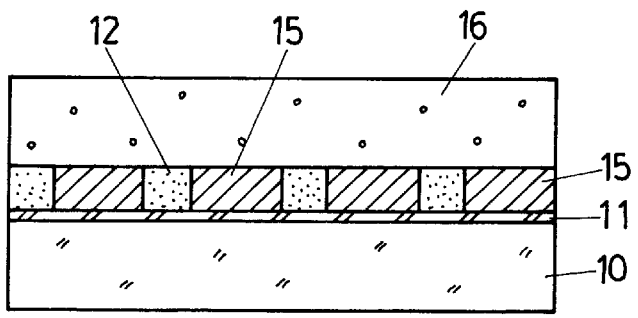

Then, as shown in FIG. 3, the entire surface of the substrate 10 is coated with a thermosetting resin 16 consisting of polyimide resin by a spin coating process.

Thereafter, a heat treatment at a temperature of 150° C. or higher is applied to harden the thermosetting resin 16 consisting of polyimide resin.

Subsequently, after dissolving all copper constituting the substrate 10 by immersing the whole body thereof in a nitric acid solution, titanium (Ti) constituting the electrode film 11 is dissolved using a 1% hydrofluoric acid solution.

Figure 4:
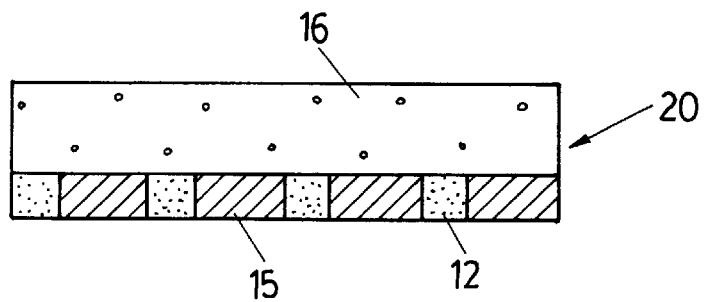

In this process of dissolution treatment, the first thermoelectric bodies 15, the photosensitive resin 12, and the photosetting resin 16 remain as they are, as shown in FIG. 4, because all of them are insoluble in nitric acid and hydrofluoric acid, thus forming a first thermoelectric structure 20.

Figure 5:
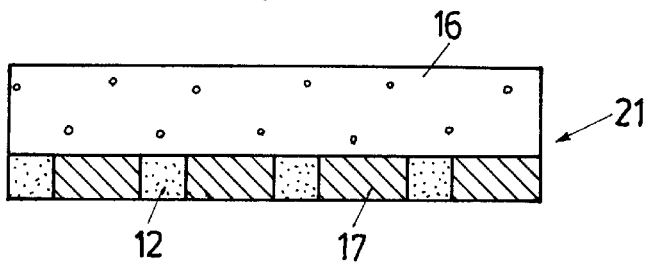

The foregoing describes the process of forming the first thermoelectric structure 20 comprising the first thermoelectric bodies 15, and a second thermoelectric structure 21 as shown in FIG. 5 is formed by the same process as described in the foregoing except for a process of forming second thermoelectric bodies 17 by plating with a second thermoelectric material. The process of forming the second thermoelectric bodies 17 by plating with the second thermoelectric material is described hereafter.

After the process as shown in FIG. 1 is completed, the second thermoelectric bodies 17 consisting of the second thermoelectric material are formed inside openings 13 provided in a thermoelectric resin 12 by means of a plating process (not shown). A Bi—Te—Sb alloy which is a P type semiconductor is used as the material for the second thermoelectric bodies 17.

A plating electrolyte used for forming the second thermoelectric bodies 17 of P type semiconductor is a nitric acid solution containing $Bi(NO_3)_3$, $TeO_2$, and $SbCl_3$.

The Bi—Te—Sb alloy is deposited on an electrode film 11 inside the openings 13 provided in the photosensitive resin 12 by applying 1V between the electrode film 11 serving as a cathode and a platinum (Pt) electrode serving as an anode.

In this plating process also, the second thermoelectric bodies 17 are deposited only inside the openings 13 provided in the photosensitive resin 12 because the underside surface of a substrate 10 is protected by a polymer film formed thereon; thickness of each of the second thermoelectric bodies 17 can be controlled by measuring the quantity of reaction electric charge such that each has the same thickness as that of a dry film, namely 50 $\mu$m.

Also, the composition of the alloy constituting the second thermoelectric bodies 17 can be altered by varying the ion concentration of Bi, Te, and Sb, contained in the plating electrolyte, the composition of the thermoelectric bodies 17 can be controlled so that they will have the required output voltage and resistance.

The second thermoelectric structure 21 as shown in FIG. 5 can be formed by applying the same treatment processes as those applied for fabricating the first thermoelectric structure 20 described in the foregoing with reference to FIGS. 1 to 4 and FIG. 7, namely, the dissolution treatment of the polymer film formed on the underside surface of the substrate, the heat treatment, the coating process of the substrate 10 with the thermosetting resin 16, and the process of dissolving the substrate 10 and the electrode film 11.

Figure 6:
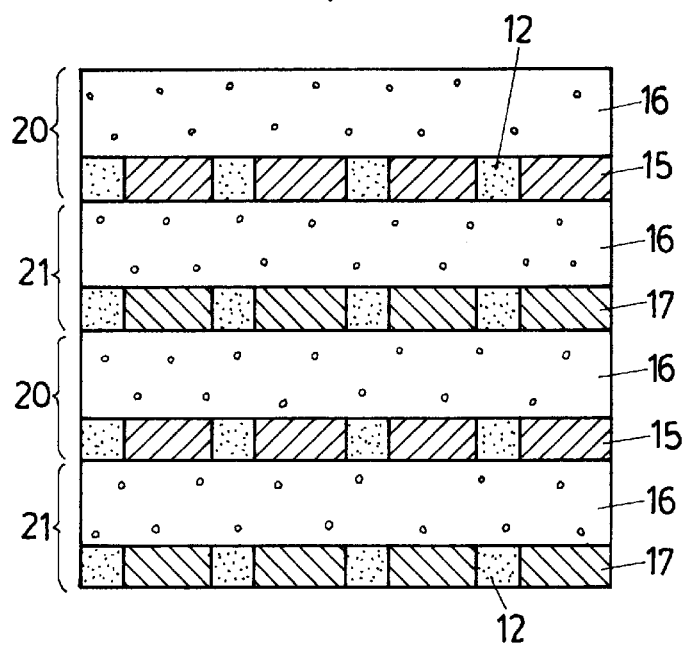

In the next step, alternating layers of the first thermoelectric structures 20 and the second thermoelectric structures 21 are formed, bonded together with an epoxy-based adhesive, and cut in a predetermined length, thus forming a laminated thermoelectric structure having a sectional view as shown in FIG. 6.

When the surface roughness of the cut surfaces is found to be so large as to affect wiring to be provided in a later stage of fabrication, the cut surfaces may be polished by a lapping method.

Figure 8:
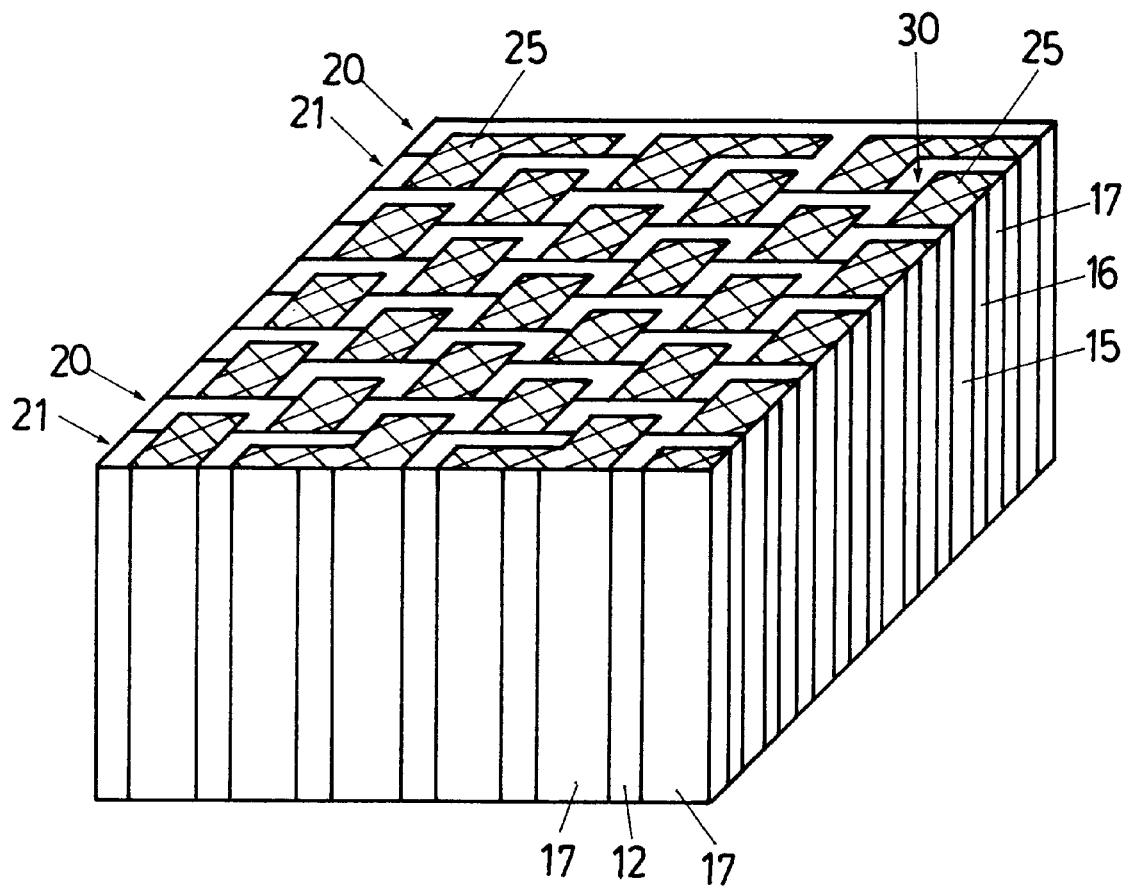

Then, as shown in FIG. 8, a gold (Au) film is formed on the entire cut surfaces of the laminated thermoelectric structure by a process of vacuum deposition, spattering, or electroless plating; wiring electrodes 25 are formed by patterning on the gold (Au) film using photolithographic techniques.

Subsequently, thermocouples 30 are formed by connecting, via the wiring electrodes 25, the end of each of the first thermoelectric structures 15 to the end of one of the second thermoelectric structures 17, adjacent to the former, on the cut end surface of the laminated thermoelectric structure. A thermoelectric power generation unit is fabricated by connecting all the thermocouples 30 together in series.

In the aforesaid method of manufacturing the thermoelectric power generation unit, patterning of the photosensitive resin 12 of dry film can be achieved with accuracy within plus or minus several $\mu$m.

Also, the first thermoelectric bodies 15 and the second thermoelectric bodies 17 can be formed by means of plating inside the openings 13 provided in the photosensitive resin 12 with the same order of patterning accuracy as that in patterning on the photosensitive resin 12, namely, within plus or minus several $\mu$m.

It can be said from the foregoing that in comparison with the conventional mechanical working process or thick film method by screen printing, this method of the first embodiment can achieve much higher dimensional accuracy, and furthermore, in the first embodiment, the thickness and composition of the first thermoelectric bodies 15 and the second thermoelectric bodies 17, which are formed by a plating process, are controlled with greater ease, and the preprocessing for dissolving the materials is made easier.

In the method described as above for manufacturing a thermoelectric power generation unit comprising a photolithographic process, plating process, and a vacuum deposition process or an etching process, manufacturing processes can be carried out on a batch basis. Accordingly, the method has an advantage of being able to fabricate a plurality of thermoelectric structures simultaneously.

Typically, a thermoelectric power generation unit manufactured by the method described as above comprises the first thermoelectric bodies 15 and the second thermoelectric bodies 17, each single body having width of 150 $\mu$m and spaced at 50 $\mu$m; total thickness thereof including the thermosetting resin 16 is 100 $\mu$m.

Assuming that the width of the substrate 10 including the thickness of a whole unit of laminated layers is 1 cm, 2500 pairs of the thermocouples 30 can be formed on the substrate 10.

If a temperature difference of 2° C. is applied to a thermoelectric power generation unit manufactured as above, an open circuit voltage of 2V is obtained, which is sufficient to drive a portable electronic equipment like, for example, a wrist watch.

Further, assuming that the length of the thermoelectric power generation unit is 2 mm, internal impedance will be 13 k$\Omega$, demonstrating that the unit is technically viable for use in an electronic equipment.

Second Embodiment

Now referring to FIGS. 1 and 2, and FIGS. 4 to 9, the method of manufacturing a thermoelectric power generation unit according to the second embodiment of the invention is described. Since FIGS. 1 to 8 are for common use with the first embodiment as above, the second embodiment is described with added reference to FIG. 9.

The method of manufacturing a thermoelectric power generation unit according to the second embodiment is the same as that of the first embodiment to the extent that it comprises a process of forming the electrode film 11 on the substrate 10 made of copper sheet, a process of coating with the photosensitive resin 12, a patterning process, a process of coating the underside surface of the substrate 10 with the polymer film, a process of forming the first thermoelectric bodies 15 and the second thermoelectric bodies 17, a process of exfoliating the polymer film from the underside surface of the substrate 10, and a heat treatment process as described in the case of the first embodiment referring to FIGS. 1, 2, and 7.

Figure 9:
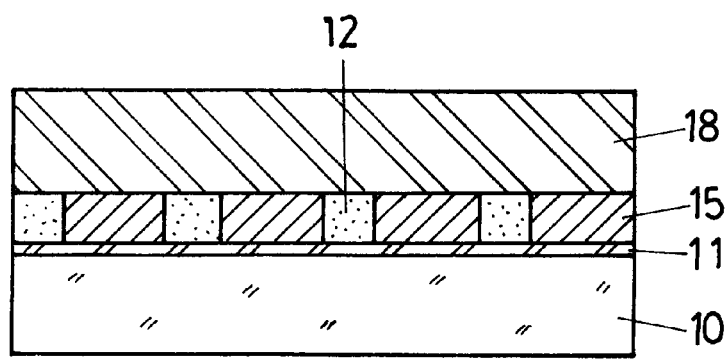
FIG. 9 illustrates part of the manufacturing process adopted in the second embodiment embodying the method of manufacturing a thermoelectric power generation unit according to the invention.

The manufacturing method according to the second embodiment differs from that of the first embodiment only in that in the second embodiment, a heat insulating sheet 18 as shown in FIG. 9 is used in place of the thermosetting resin 16; for the heat insulating sheet 18, a glass sheet of 100 $\mu$m in thickness is used and bonded onto the photosensitive resin 12 and the first thermoelectric bodies 15 with an epoxy-based adhesive.

By applying the same treatment processes as in the case of the first embodiment to a workpiece in a state as shown in FIG. 9, copper of the substrate 10 is removed by use of a nitric acid solution, and further, titanium of the electrode film 11 is dissolved and removed by use of 1% hydrofluoric acid solution, forming a first thermoelectric structure 20 as shown in FIG. 4 (provided that the thermosetting resin 16 is substituted by the heat insulating sheet 18); by means of the same treatment process, a second thermoelectric structure 21 as shown in FIG. 5 is formed.

Subsequently, by applying the same treatment process as in the case of the first embodiment as shown in FIGS. 6 and 8, alternated layers of the first thermoelectric structures 20 and the second thermoelectric structures 21 (provided that the thermosetting resin 16 is substituted by the heat insulating sheet 18) are formed, bonded together, and then cut in a predetermined length.

Then, by forming wiring electrodes 25 as shown in FIG. 8, a thermoelectric power generation unit comprising a plurality of thermocouples 30 connected in series is completed.

In the second embodiment embodying the method of manufacturing a thermoelectric power generation unit according to the invention, the fabrication of a micro-sized thermoelectric power generation unit is attained with higher accuracy than that by the conventional methods. Also, the shape and composition of thermoelectric power generation elements (thermocouples) can be controlled with ease.

As the heat insulating sheet 18 is interposed between the first thermoelectric structure 20 and the second thermoelectric structure 21, the hardness of the thermoelectric structures during the manufacturing process according to the second embodiment is increased over that in the case of the first embodiment, enhancing the reliability of a process of dissolving the substrate 10 protecting against distortion and warping, and enabling to deal with larger substrates.

Third Embodiment

Now referring to FIGS. 1 and 3, and FIGS. 10 to 13, the method of manufacturing a thermoelectric power generation unit according to the third embodiment of the invention is described.

The method of manufacturing a thermoelectric power generation unit according to the third embodiment is the same as described in the first embodiment with reference to FIGS. 1 and 2 to the extent that it comprises a process of forming the electrode film 11 on the substrate 10 made of copper sheet, a process of coating with the photosensitive resin 12, a patterning process, a process of coating the underside surface of the substrate 10 with the polymer film, a process of forming the first thermoelectric bodies 15 and the second thermoelectric bodies 17, a process of exfoliating the polymer film from the underside surface of the substrate 10, and a heat treatment process.

Figure 10:
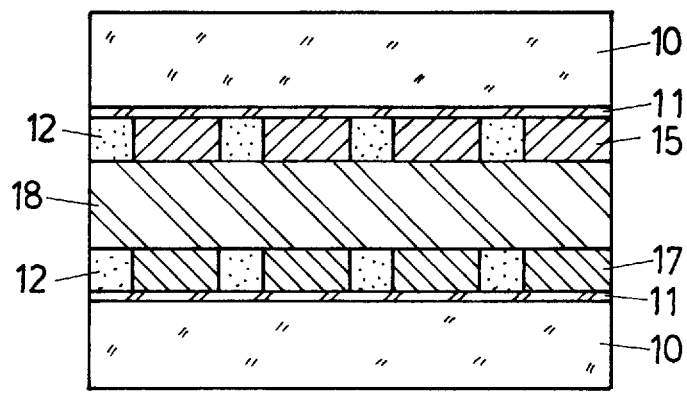
FIGS. 10 to 13 illustrate the manufacturing process adopted in the third embodiment according to the invention. Also.

As shown in FIG. 10, a substrate 10 on which first thermoelectric bodies 15 are formed and the other substrate 10 on which second thermoelectric bodies 17 are formed are bonded together with a heat insulating sheet 18 interposed in-between. A sheet glass of 100 $\mu$m in thickness is used for the heat insulating sheet 18.

The substrate 10 with the first thermoelectric bodies 15 formed thereon is bonded with the other substrate 10 with the second thermoelectric bodies 17 formed thereon such that, as shown in FIG. 10, the surfaces of the first thermoelectric bodies 15 and the second thermoelectric bodies 17 face the respective surfaces of the heat insulating sheet 18. Such bonding as stated above is performed using an epoxy-based adhesive.

Figure 11:
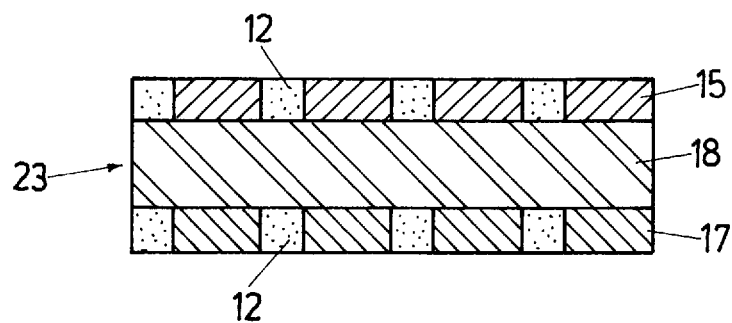

Then, the substrate 10 with the first thermoelectric bodies 15 formed thereon bonded with the other substrate 10 with the second thermoelectric bodies 17 formed thereon with the heat insulating sheet 18 interposed in-between is immersed entirely in a nitric acid solution, dissolving and removing all the copper for use as the material of respective substrates 10, and titanium for use as the material of the electrode films 11 is dissolved and removed using a 1% hydrofluoric acid solution. Thus, a composite thermoelectric structure 23 is formed as shown in FIG. 11.

Figure 12:
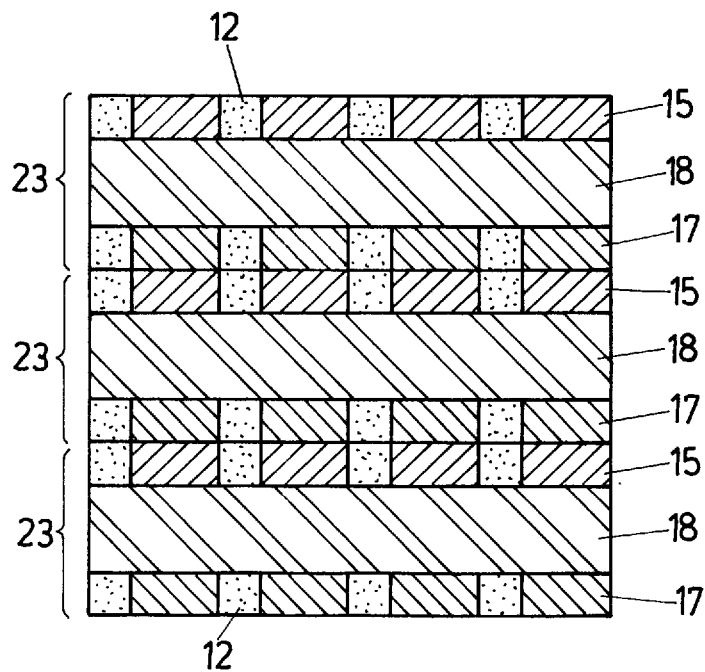

In the next step, as shown in FIG. 12, a plurality of the composite thermoelectric structures 23 are laminated such that the layer of the first thermoelectric bodies 15 is opposed to the layer of the second thermoelectric bodies 17, bonded together using an epoxy-based adhesive, and cut in a predetermined length.

At this point in time, the first thermoelectric bodies 15 are not electrically connected with the second thermoelectric bodies 17 because respective composite thermoelectric structures 23 are isolated from each other by the insulating epoxy-based adhesive used for bonding.

If the surface roughness of the cut surfaces of a thermoelectric power generation element formed as described above is so large as to affect wiring to be provided in a later stage of processing, the cut surfaces of the element may be polished by a lapping method.

Figure 13:
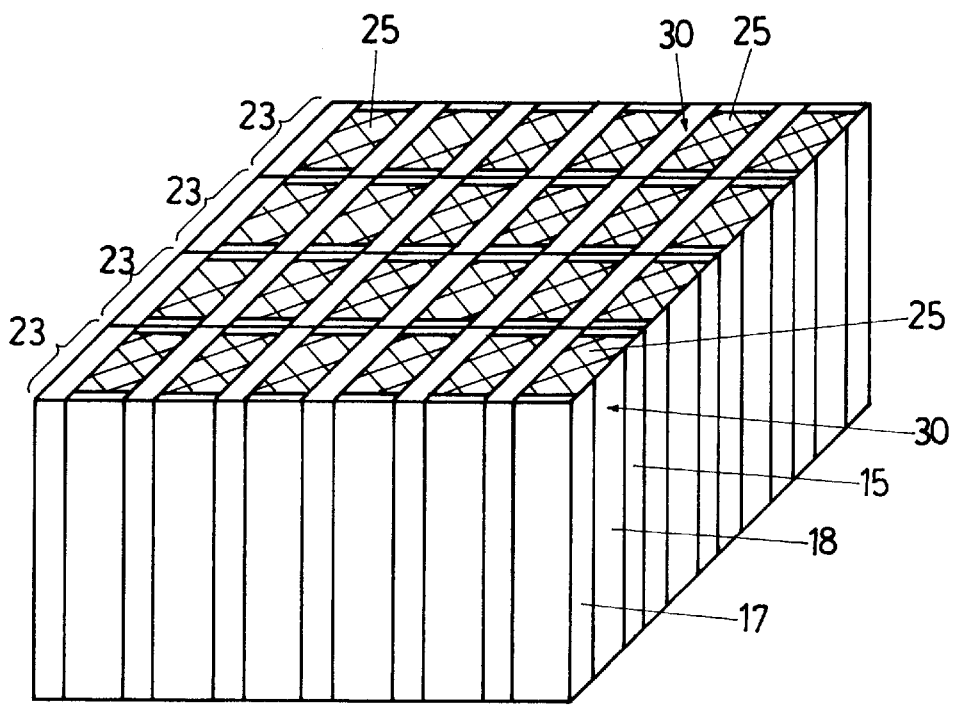

Then, as shown in FIG. 13, a gold (Au) film is formed on the entire cut surfaces of the element by a process of vacuum deposition, spattering, or electroless plating; wiring electrodes 25 are formed by patterning on the gold (Au) film using a photolithographic technique.

Subsequently, a thermocouple 30 is formed by connecting through wiring electrodes 25 the end of one of the first thermoelectric structures 15 with the end of one of the second thermoelectric structures 17 showing themselves adjacent to each other on the cut surfaces of the element. Finally, a thermoelectric power generation unit is fabricated by connecting all the thermocouples 30 together in series.

By the method of manufacturing a thermoelectric power generation unit according to the third embodiment, a micro-sized thermoelectric power generation unit can be fabricated with higher precision than by the conventional methods. In addition, the shape and composition of the thermoelectric power generation element (thermocouple) can be controlled with ease.

Furthermore, an increase in the hardness of the power generation unit is achieved due to the fact that the heat insulating sheet 18 is interposed between respective composite thermoelectric structures 23, and the thickness of the heat insulating sheet 18 is halved compared to that from the same in the case of the second embodiment, permitting the thickness of a thermoelectric power generation element to be reduced as well. Thus, this method is suitable for further miniaturization of a thermoelectric power generation unit.

Fourth Embodiment

The method of manufacturing a thermoelectric power generation unit according to the fourth embodiment of the invention is described hereafter with reference to FIGS. 14 to 18 and FIG. 8.

Figure 14:
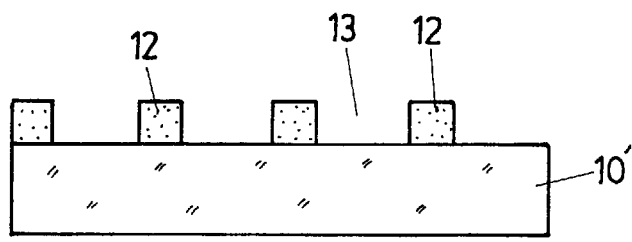
FIGS. 14 to 18 illustrate the manufacturing process adopted in the fourth embodiment according to the invention. Also.

For a substrate 10' as shown in FIG. 14, a metal sheet made of titanium is used. A photosensitive resin 12 is formed on the entire surface of the substrate 10'; as the photosensitive resin 12, a photosensitive dry film 50 $\mu$m in thickness is formed by a roll coater.

As shown in FIG. 14, a pattern in the form of stripes is created on the photosensitive resin 12 of the dry film by means of a photolithographic technique consisting of a light exposure treatment for striking objects with light through a photo mask and a development treatment for dissolving and removing unexposed portions only.

Although not shown in FIG. 14, the underside surface of the substrate 10' is entirely coated with a Teflon-based polymer film by a spin coating process after the photosensitive resin 12 is formed.

The polymer film is coated on the underside of the substrate 10' to prevent a metallic deposit from being formed on the underside surface of the substrate 10' in a stage of a plating process described hereafter.

Figure 15:
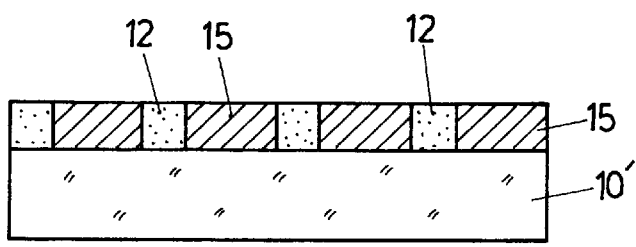

Subsequently, the first thermoelectric bodies 15 made of a first thermoelectric material are formed by means of plating on the substrate 10 ' inside openings 13 of the photosensitive resin 12 as shown in FIG. 15.

A Bi—Te—Se alloy which is an N type semiconductor is used as the material for the first thermoelectric bodies 15 to be formed inside the openings 13 of the photosensitive resin 12.

A plating electrolyte used for forming the first thermoelectric bodies 15 made of N type semiconductors is a nitric acid solution containing $Bi(NO_3)_3$, $TeO_2$, and $SeO_2$. The Bi—Te—Se alloy is deposited on the substrate 10' inside the openings of the photosensitive resin 12 by applying a voltage of 1V between the substrate 10' serving as a cathode and a platinum (Pt) electrode serving as an anode.

When forming the first thermoelectric bodies 15 by plating as stated above, the first thermoelectric bodies 15 can be deposited on the substrate 10' only in the regions within the openings surrounded by the photosensitive resin 12 because the underside surface of the substrate 10' is protected by the polymer film.

In the plating process for forming the first thermoelectric bodies 15, the amount of metallic deposit is determined according to the quantity of electric charge which can be calculated on the basis of electric current consumed during electrolysis. For this reason, the thickness of the first thermoelectric bodies 15 can be controlled to be a required value with ease by measuring the quantity of electric charge.

Setting is made such that the first thermoelectric bodies 15 will have the same thickness as that of the photosensitive resin 12, namely 50 $\mu$m.

Further, the chemical composition of the alloy can be altered by varying the ion concentrations of Bi, Te, and Se contained in the plating electrolyte, and the selection of the material for the first thermoelectric bodies 15, having a required output voltage and resistance value, becomes possible by varying the set conditions for ion concentration of the aforesaid metals.

After the plating of the thermoelectric bodies 15 is completed, the polymer film is exfoliated and removed by toluene from the underside surface of the substrate 10'.

Next the first thermoelectric bodies 15 formed on the substrate 10' are heat treated in a nitrogen atmosphere at 350° C. for one hour.

The heat treatment in a nitrogen atmosphere is applied for homogenizing the composition of the alloy of the first thermoelectric bodies 15 so that the output of a thermoelectric power generation unit is enhanced.

Figure 16:
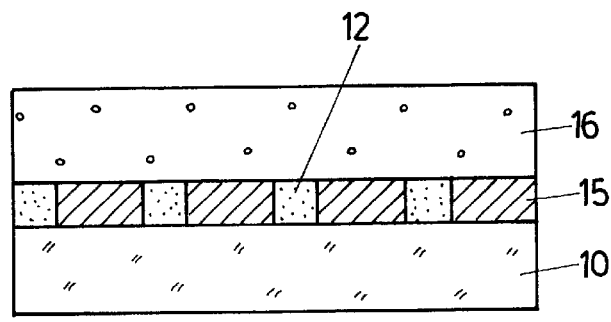

Then, as shown in FIG. 16, a thermosetting resin 16 consisting of polyimide resin is formed by a spin coating process on the surface of both the photosensitive resin 12 and the first thermoelectric bodies 15 on the substrate 10.

Thereafter, a heat treatment at temperature of 150° C. or higher is applied to harden the thermosetting resin 16, namely, polyimide resin.

Figure 17:
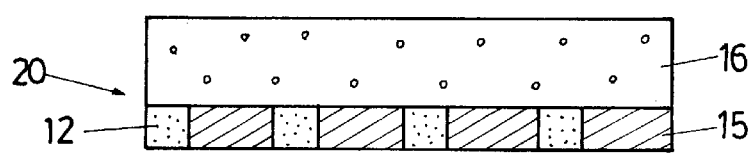

Subsequently, the whole body of a thermoelectric power generation element comprising the photosensitive resin 12 and the first thermoelectric bodies 15 with the thermosetting resin 16 formed thereon as shown in FIG. 17 is immersed in a 1% hydrofluoric acid solution, dissolving and removing titanium making up the substrate 10.

In this process of dissolution treatment, the first thermoelectric bodies 15, the photosensitive resin 12, and the thermosetting resin 16 remain as they are because all of them are insoluble in a hydrofluoric acid, thus forming a first thermoelectric structure 20.

The foregoing describes the process of forming the first thermoelectric structure 20 comprising the first thermoelectric bodies 15, and a second thermoelectric structure 21, as shown in FIG. 5 in the first embodiment, is formed by the same process as described in the foregoing.

In this case, the process of forming second thermoelectric bodies 17 by plating with a second thermoelectric material is different from the above. The process of forming the second thermoelectric bodies 17 by plating with the second thermoelectric material is described hereafter.

After the process as shown in FIG. 14 is completed, the second thermoelectric bodies 17 made of the second thermoelectric material are formed on the substrate 10' inside the openings 13 provided in the thermoelectric resin 12 by means of the plating process (not shown in FIG. 14).

A Bi—Te—Sb alloy which is a P type semiconductor is used as the material for the second thermoelectric bodies 17, A plating electrolyte used for forming the second thermoelectric bodies 17 made of a P type semiconductor is a nitric acid solution containing $Bi(NO_3)_3$, $TeO_2$, and $SbCl_3$. The Bi—Te—Sb alloy is deposited on the substrate 10' inside the openings 13 provided in the photosensitive resin 12 by applying a voltage of 1V between the substrate 10' serving as a cathode and a platinum (Pt) electrode serving as an anode.

In this plating process also, the second thermoelectric bodies 17 are deposited only inside the openings 13 provided in the photosensitive resin 12 because the underside surface of the substrate 10' is protected by a polymer film formed thereon.

The thickness of the second thermoelectric bodies 17 is controlled by measuring the quantity of reaction electric charge so that it is the same as the thickness of a dry film making up the photosensitive resin 12, namely 50 $\mu$m.

Also, the composition of the alloy is altered by varying the ion concentration of Bi, Te, and Sb, contained in the plating electrolyte, controlling the properties of the thermoelectric bodies 17 so that they will have a required output voltage and resistance.

A second thermoelectric structure 21 is formed by the same treatment processes as those applied for fabricating the first thermoelectric structure 20 described in the foregoing with reference to FIGS. 14 to 17, namely, a dissolution treatment of the polymer film formed on the underside surface of the substrate, a heat treatment process, a process of coating with the thermosetting resin 16, and a process of dissolving the substrate 10'.

Figure 18:
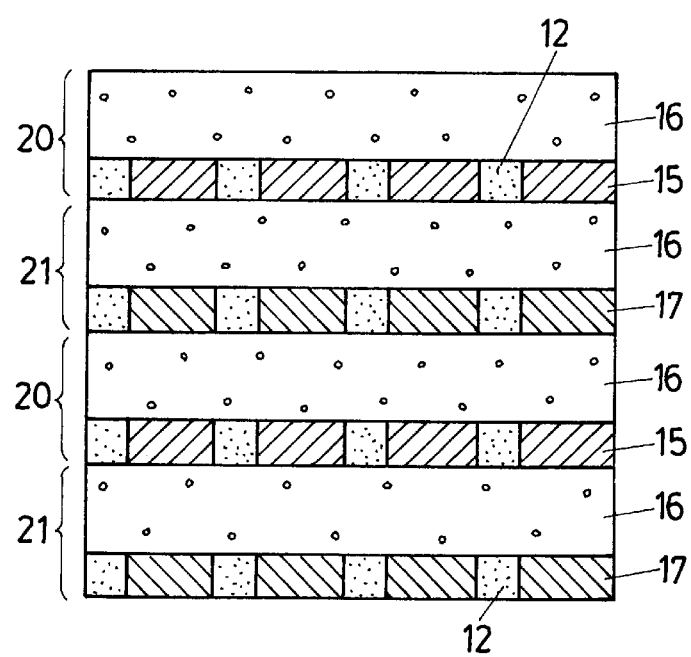

In the next step, alternating layers of the first thermoelectric structures 20 and the second thermoelectric structures 21 are formed as shown in FIG. 18, and bonded together with an epoxy-based adhesive.

By cutting the above in a predetermined length, a laminated thermoelectric structure having the thermosetting resin 16 interposed between the first thermoelectric structures 20 and the second thermoelectric structures 21 is formed.

If the surface roughness of the cut surfaces after the cutting process is found to be so large as to affect wiring to be provided in a later stage of fabrication, the cut surfaces may be polished by a lapping method.

Then, a gold (Au) film is formed on the entire cut surfaces of the laminated thermoelectric structure by a process of vacuum deposition, spattering, or electroless plating.

Then, wiring electrodes 25 are formed by patterning on the gold film using a photolithographic technique in the same manner as shown in FIG. 8 in the first embodiment.

Subsequently, a thermocouple 30 is formed by connecting, with the wiring electrodes 25, the end of one of the first thermoelectric structures 15 to the end of one of the second thermoelectric structures 17 showing themselves adjacent to each other on the cut surface of the laminated thermoelectric structure.

Finally, a thermoelectric power generation unit is fabricated by connecting all the thermocouples 30 together in series.

By the method of manufacturing a thermoelectric power generation unit according to the fourth embodiment, a micro-sized thermoelectric power generation unit can be formed with higher accuracy than by the conventional methods. In addition, the shape and composition of a thermoelectric power generation element (thermocouple) can be controlled with ease.

Furthermore, in the fourth embodiment, a titanium film serving as an electrode film 11 is not formed on a substrate 10' as opposed to the first through third embodiments. Therefore, the method of manufacturing a thermoelectric power generation unit according to the fourth embodiment has an added advantage of further simplification in its manufacturing process.

Fifth Embodiment

The method of manufacturing a thermoelectric power generation unit according to the fifth embodiment of embodying the invention is described hereafter with reference to FIGS. 14 and 15, FIGS. 17 to 19, and FIG. 8.

In the fifth embodiment, in the same manner as in the case of the preceding forth embodiment, a titanium sheet is used for a substrate 10' as shown in FIGS. 14 and 15, and succeeding processes of coating and patterning with a photosensitive resin 12, coating the underside surface of the substrate 10' with a polymer film, forming first thermoelectric bodies 15 or second thermoelectric bodies 17, and exfoliating the polymer film from the underside of the substrate 10' are the same as applied in the fourth embodiment.

Figure 19:
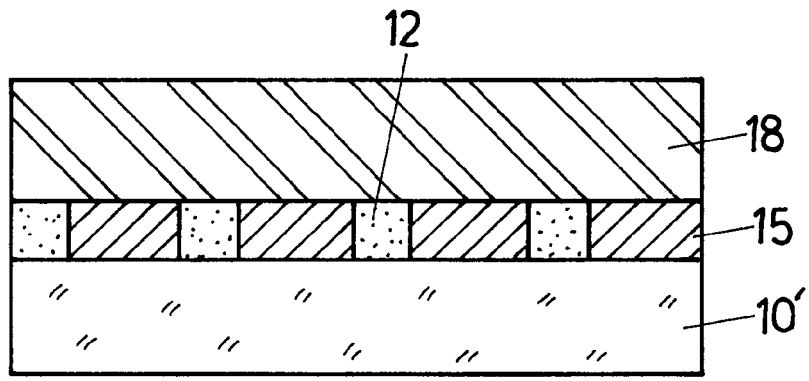
FIG. 19 illustrates part of the manufacturing process adopted in the fifth embodiment according to the invention.

In the next step, as opposed to the case of the fourth embodiment, a heat insulating sheet 18 in place of a thermosetting resin 16 is formed, as shown in FIG. 19, on a photosensitive resin 12 and first thermoelectric bodies 15 which are disposed on a substrate 10'. For the heat insulating sheet 18, a glass sheet of 100 μm in thickness is used, and bonded to the surface of the photosensitive resin 12 and the first thermoelectric bodies 15 by a bonding means.

Then, as shown in FIG. 17, titanium making up the substrate 10' is dissolved and removed using a 1% hydrofluoric acid solution, to a first thermoelectric structure 20. Further, through the same treatment process, a second thermoelectric structure 21 is formed.

Subsequently, as shown in FIG. 18, alternated layers of the first thermoelectric structures 20 and the second thermoelectric structures 21 are formed, bonded together, and cut, forming a laminated thermoelectric structure.

Then, a gold (Au) film is formed on the entire cut surfaces of the laminated thermoelectric structure by a process of vacuum deposition, spattering, or electroless plating, and wiring electrodes 25 are formed by patterning on the gold (Au) film using a photolithographic technique in the same manner as shown in FIG. 8 in the first embodiment, thus forming a thermoelectric power generation unit.

By the method of manufacturing a thermoelectric power generation unit according to the fifth embodiment, a micro-sized thermoelectric power generation unit can be formed with higher accuracy than by the conventional methods. In addition, the shape and composition of a thermoelectric power generation element (thermocouple) can be controlled with ease.

In the fifth embodiment wherein a heat insulating sheet 18 is interposed between the first thermoelectric structures 20 and the second thermoelectric structures 21, this method of manufacturing a thermoelectric power generation unit according to the invention can be applied to substrates in larger sizes.

Sixth Embodiment

The method of manufacturing a thermoelectric power generation unit according to the sixth embodiment of the invention is described hereafter with reference to FIGS. 14 and 15, FIG. 20, and FIGS. 11 to 13.

Figure 20:
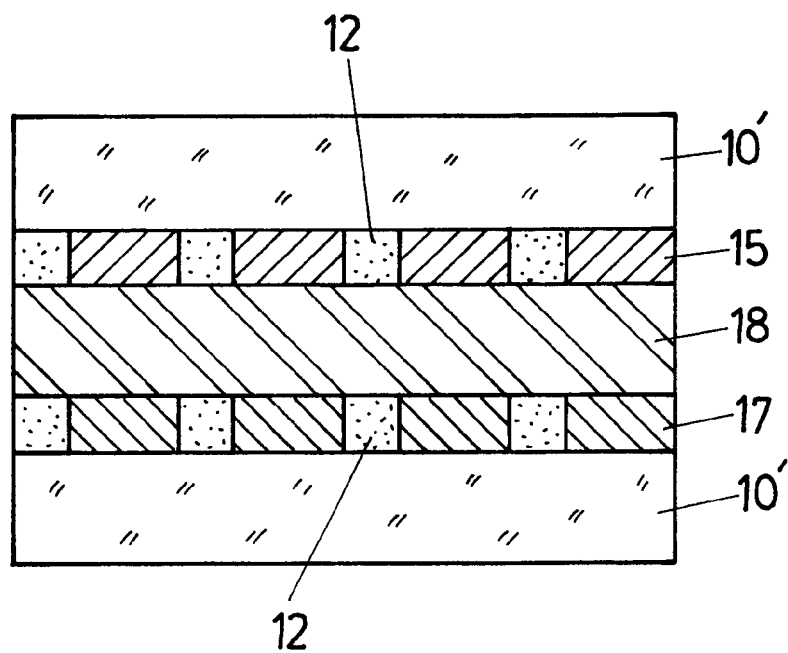
FIG. 20 illustrates part of the manufacturing process adopted in the sixth embodiment according to the invention.

In the sixth embodiment, in the same manner as in the case of the aforesaid fourth embodiment, a titanium sheet is used for a substrate 10' as shown in FIGS. 14 and 15, and succeeding processes of coating and patterning with a photosensitive resin 12, coating the underside surface of the substrate 10' with a polymer film, forming first thermoelectric bodies 15 or second thermoelectric bodies 17, exfoliating the polymer film from the underside of the substrate 10', and heat treatment are the same as applied in the fourth embodiment As shown in FIG. 20, a substrate on which first thermoelectric bodies 15 are formed and the other substrate on which second thermoelectric bodies 17 are formed are bonded together with a heat insulating sheet 18 interposed in-between; a sheet glass 100 μm in thickness is used for the heat insulating sheet 18.

The substrate 10' with the first thermoelectric bodies 15 formed thereon is bonded to the other substrate 10' with the second thermoelectric bodies 17 formed thereon such that the surfaces of the first thermoelectric bodies 15 and the second thermoelectric bodies 17 face the respective surfaces of the heat insulating sheet 18 using an epoxy-based adhesive.

Then, the substrate 10' with the first thermoelectric bodies 15 formed thereon bonded to the other substrate 10' with the second thermoelectric bodies 17 formed thereon with the heat insulating sheet 18 interposed in-between is immersed in a 1% hydrofluoric acid solution, dissolving and removing titanium used as the material of respective substrates 10'. Thus, a composite thermoelectric structure 23 is formed as shown in FIG. 11 in the aforesaid third embodiment.

In the next step, as shown in FIG. 12, a plurality of the composite thermoelectric structures 23 are laminated such that the layer of the first thermoelectric bodies 15 is opposed to the layer of he second thermoelectric bodies 17, bonded together using an epoxy-based adhesive, and cut in a predetermined length.

At this point, the first thermoelectric bodies 15 are not electrically connected with the second thermoelectric bodies 17 because respective composite thermoelectric structures 23 are isolated from each other by the insulating epoxy-based adhesive used for bonding although not shown in FIG. 12.

If the surface roughness of the cut surfaces of a thermoelectric power generation element formed as described above is so large as to affect wiring to be provided in a later stage of processing, the cut surfaces of the element may be polished by a lapping method.

Then, as shown in FIG. 13, a gold (Au) film is formed on the entire cut surfaces of the element by a process of vacuum deposition, spattering, or electroless plating; wiring electrodes 25 are formed by patterning on the gold film using a photolithographic technique.

Subsequently, a thermocouple 30 is fabricated by connecting, through the wiring electrodes 25, the end of one of the first thermoelectric structures 15 with the end of one of the second thermoelectric structures 17 showing themselves adjacent to each other on the cut surfaces of the element. Finally, a thermoelectric power generation unit is manufactured by connecting all the thermocouples 30 together in series.

By the method of manufacturing a thermoelectric power generation unit according to the sixth embodiment, a microsized thermoelectric power generation unit can be manufactured with higher precision than by the conventional methods. In addition, the shape and composition of the thermoelectric power generation element (thermocouple) can be controlled with ease.

Furthermore, an increase in the hardness of the power generation unit is achieved due to the fact that the heat insulating sheet 18 is interposed between respective composite thermoelectric structures 23, and as a result, the thickness of the heat insulating sheet 18 can be reduced in half from same in the case of the fifth embodiment, permitting the thickness of laminated thermoelectric power generation elements to be reduced as well. Thus, this method is suitable for further miniaturization of a thermoelectric power generation unit.

Seventh Embodiment

The method of manufacturing a thermoelectric power generation unit according to the seventh embodiment of the invention is described hereafter with reference to FIGS. 21 through 28.

Figure 21:
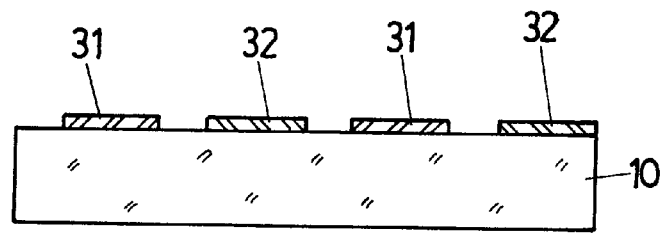
FIGS. 21 to 28 illustrate the manufacturing process adopted in a seventh embodiment according to the invention. Also.

As shown in FIG. 21, a copper sheet with its upper surface coated with an insulating film (not shown), for example, a $SiO_2$ film, is used for a substrate 10.

The insulating film made of $SiO_2$ is a film provided to prevent short circuiting between two electrode films to be formed at a later stage of processing caused by copper of the substrate 10.

In the next step, a titanium film 500 nm in thickness serving as an electrode film is formed on the entire upside surface of the substrate 10 by a vacuum deposition process.

Figure 22:
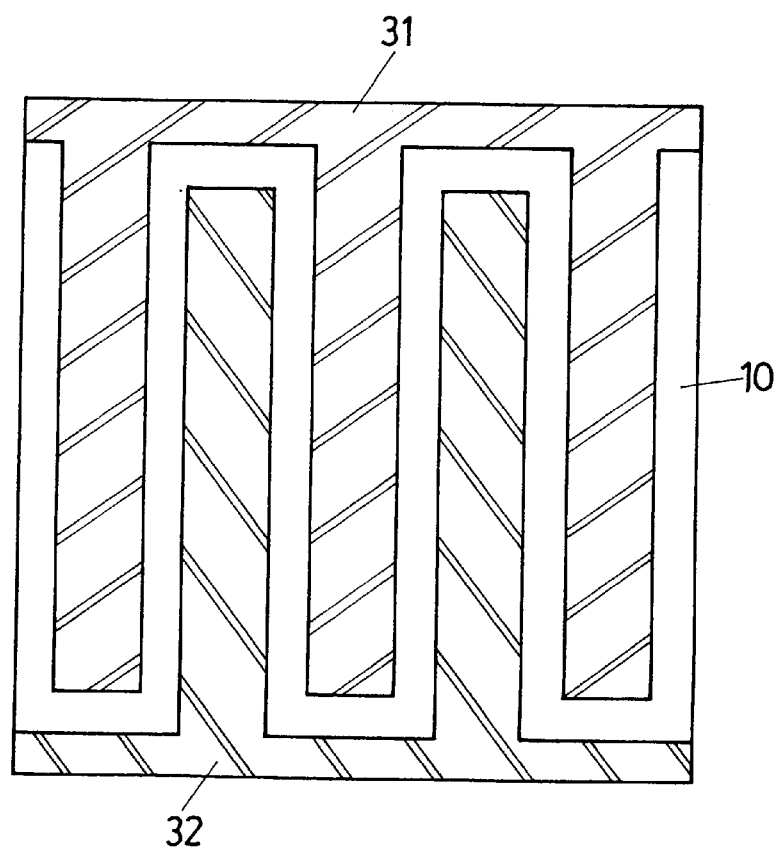

Then, patterning is made on the titanium film, namely, electrode film using photolithographic techniques and etching techniques such that a plane pattern in the shape substantially resembling teeth of two combs disposed opposite to each other, each tooth mutually interposed, is created, thus forming a first electrode film 31 and a second electrode film 32. FIG. 22 is a plan view showing the shape of the plane pattern of the first electrode film 31 and the second electrode film 32.

Subsequently, a photosensitive resin 12 is formed on the entire surface of the substrate 10 on which the first electrode film 31 and the second electrode film 32 are provided; as the photosensitive resin 12, a photosensitive dry film 50 µm in thickness is formed by a roll coater.

Figure 23:
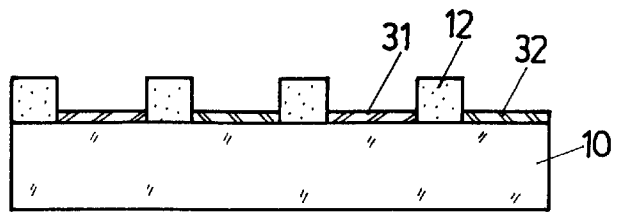

As shown in FIG. 23, the photosensitive resin 12 is formed in gap regions between the first electrode film 31 and the second electrode film 32 using a photolithographic technique such that a pattern in the shape of stripes is made.

After the photosensitive resin 12 is formed, the underside surface of the substrate 10 is entirely coated with a Teflon-based polymer film using a spin coating process although not shown in FIG. 23.

Figure 24:
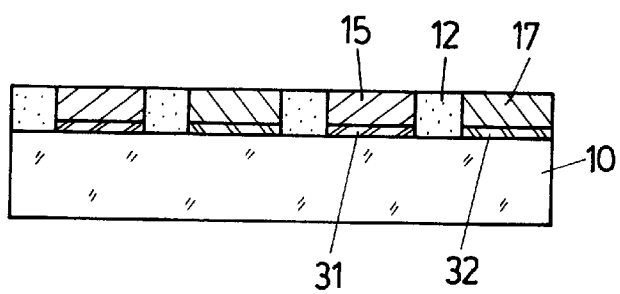

Then, as shown in FIG. 24, first thermoelectric bodies 15 made of first thermoelectric material are formed first on the first electrode film 31 by plating inside openings 13 of the photosensitive resin 12.

A Bi—Te—Se alloy which is an N type semiconductor is used as the material for the first thermoelectric bodies 15 formed on the first electrode film 31.

A plating electrolyte used for forming the first thermoelectric bodies 15 made of an N type semiconductor is a nitric acid solution containing $Bi(NO_3)_3$, $TeO_2$, and $SeO_2$.

The Bi—Te—Se alloy is deposited on the first electrode film 31 inside the openings 13 of the photosensitive resin 12 by applying a voltage of 1V between the first electrode film 31 serving as a cathode and a platinum (Pt) electrode serving as an anode.

The thickness of the first thermoelectric bodies 15 is controlled by the quantity of reaction electric charge and set to be substantially the same as that of the photosensitive resin 12, namely, 50 µm.

Subsequently, second thermoelectric bodies 17 made of second thermoelectric material are formed on the second electrode film 32 inside the openings 13 provided in the thermoelectric resin 12 by means of the plating process.

A Bi—Te—Sb alloy which is P type semiconductor is used as the material for the second thermoelectric bodies 17 made of the second thermoelectric material which are formed on the second electrode film 32.

A plating electrolyte used for forming the second thermoelectric bodies 17 made of a P type semiconductor is a nitric acid solution containing $Bi(NO_3)_3$, $TeO_2$, and $SbCl_3$.

The Bi—Te—Sb alloy is deposited on the second electrode film 32 inside the openings 13 provided in the photosensitive resin 12 by applying 1V between the second electrode film 32 serving as a cathode and a platinum (Pt) electrode serving as an anode.

The thickness of the second thermoelectric bodies 17 is controlled by measuring the quantity of the reaction electric charge so that it is the same as that of the dry film making up the photosensitive resin 12, namely, 50 µm.

After applying a plating process twice to form the first thermoelectric bodies 15 and the second thermoelectric bodies 17, the polymer film formed on the underside surface is dissolved and removed by toluene. Thereafter, the first thermoelectric bodies 15 and the second thermoelectric bodies 17 are heat treated in a nitrogen atmosphere at 350° C. for one hour.

Figure 25:
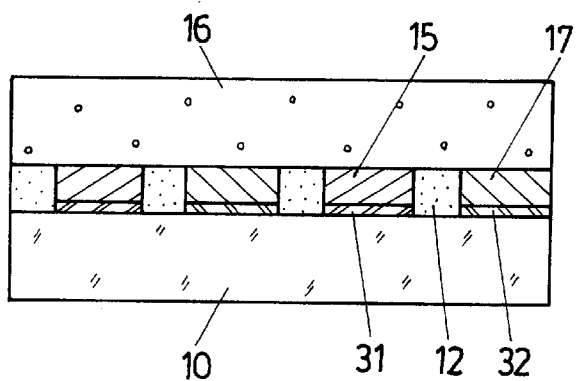

As shown in FIG. 25, a thermosetting resin 16 consisting of polyimide resin is then formed on the upper surface of the first thermoelectric bodies 15, the second thermoelectric bodies 17, and the photosensitive resin 12 using a spin coating process.

Then, the polyimide resin of the thermosetting resin 16 is hardened by applying heat treatment at a temperature of 150° C., or higher.

Subsequently, a thermoelectric structure comprises the first thermoelectric bodies 15, the second thermoelectric bodies 17, and the photosensitive resin 12 which are covered with the thermosetting resin 16 formed thereon is immersed in a nitric acid solution, dissolving all copper making up the substrate 10, and then immersed in a 1% hydrofluoric acid solution, dissolving and removing the $SiO_2$ film as the insulating film and the titanium film making up the first electrode film 31 and the second electrode film 32.

Figure 26:
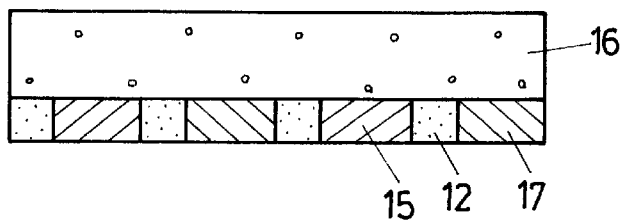

After a dissolution process stated as above, the first thermoelectric bodies 15, the second thermoelectric bodies 17, the photosensitive resin 12, and the thermosetting resin 16 remain as they are because these are all insoluble in nitric acid and hydrofluoric acid. As shown in FIG. 26, a thermoelectric structure 24 is thus formed.

Figure 27:
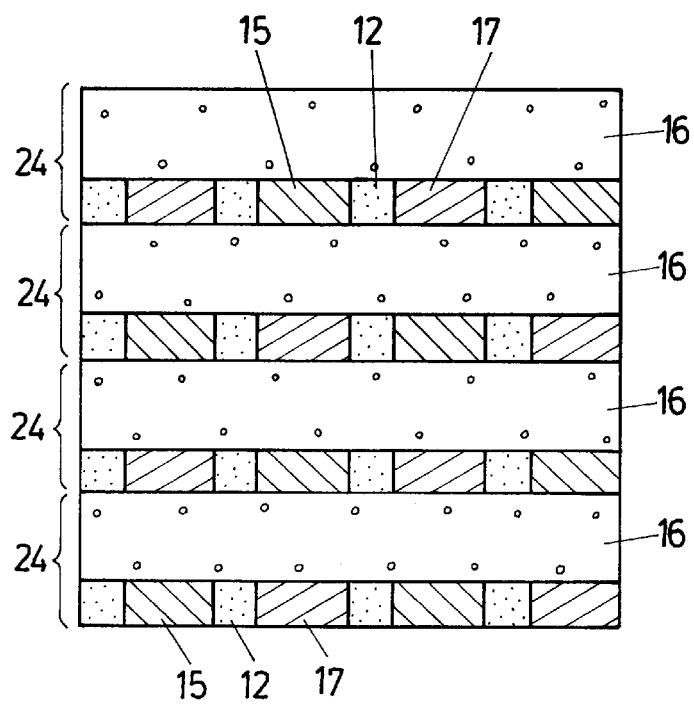

Then, a plurality of the thermoelectric structures 24 are piled up in multiple layers, and bonded to each other by an epoxy-based adhesive; by cutting it in a length as required, a laminated thermoelectric structure comprising the plurality of the thermoelectric structures 24 piled up in multiple layers is fabricated as shown in FIG. 27.

If the surface roughness of the cut end surface of an element is found to be so large as to affect wiring to be provided in a later stage of fabrication, the cut surfaces may be polished by a lapping method.

Figure 28:
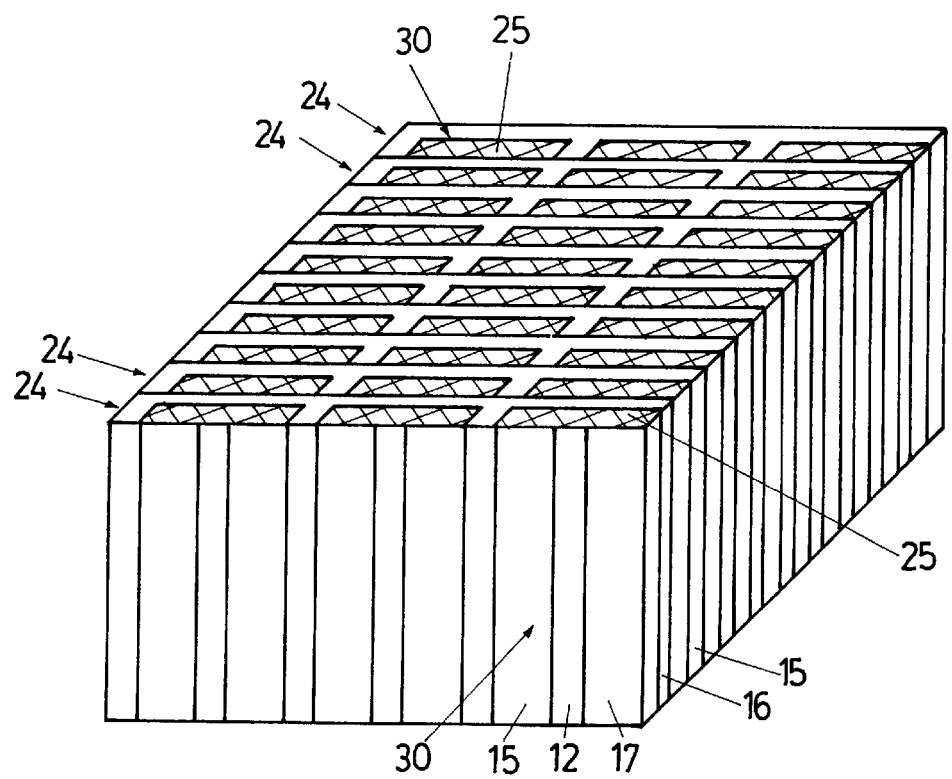

As shown in FIG. 28, a gold (Au) film is formed on the entire cut end surface of the laminated thermoelectric structure by a process of vacuum deposition, spattering, or electroless plating.

Then, wiring electrodes 25 are formed by patterning on the gold film using photolithographic techniques.

Subsequently, a thermocouple 30 is formed by connecting, with the wiring electrodes 25, the end of respective first thermoelectric bodies 15 to the end of respective second thermoelectric bodies 17 showing themselves adjacent to each other on the cut end surface of a thermoelectric power generation element.

Finally, a thermoelectric power generation unit is manufactured by connecting all the thermocouples 30 together in series.

In FIG. 28, a thermocouple is formed by connecting one of the first thermoelectric body 15 with one of the second thermoelectric bodies 17, adjacent to each other, within one thermoelectric structure 24; also, a thermocouple may be formed by connecting one of the thermoelectric structures 24 to another thermoelectric structure 24 adjacent to the former.

By the method of manufacturing a thermoelectric power generation unit according to the seventh embodiment, a micro-sized thermoelectric power generation unit can be formed with higher accuracy than by the conventional methods. In addition, the shape and composition of a thermoelectric power generation element (thermocouple) can be controlled with ease.

Eighth Embodiment

The method of manufacturing a thermoelectric power generation unit according to the eighth embodiment of the invention is described hereafter with reference to FIGS. 21 through 24, and FIGS. 26 through 29.

In the eighth embodiment, the manufacturing method is the same as that of the seventh embodiment as shown in FIGS. 21 through 24, to the extent that a copper sheet coated with an insulating film consisting of $SiO_2$ is used for a substrate 10, and succeeding steps of processing comprises:

forming an electrode film made of titanium on the substrate 10; forming a first electrode film 31 and a second electrode film 32 by patterning; coating with a photosensitive resin 12 and patterning thereon; coating the underside surface of the substrate 10 with a polymer film; forming first thermoelectric bodies 15 and second thermoelectric bodies 17; exfoliating the polymer film from the underside surface of the substrate 10; and applying heat treatment.

Figure 29:
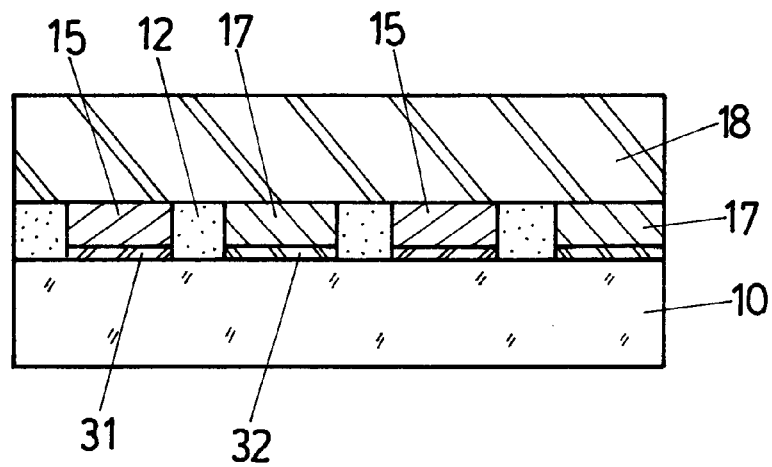
FIG. 29 illustrates part of the manufacturing process adopted in the eighth and eleventh embodiments according to the invention.

The next step differs from the seventh embodiment in that, as shown in FIG. 29, a heat insulating sheet 18 is used in place of the thermosetting resin 16. A glass sheet 100 μm in thickness is used as the heat insulating sheet 18, and bonded to the upper surfaces of the first thermoelectric bodies 15, the second thermoelectric bodies 17, and the photosensitive resin 12.

Then, as shown in FIG. 26, a thermoelectric structure 24 (using the heat insulating sheet 18 in place of the thermosetting resin 16) is formed by dissolving the copper making up the substrate 10 in a nitric acid solution, and further by dissolving and removing the $SiO_2$ film as the insulating film, the first electrode film 31, and the second electrode film 32 in a 1% hydrofluoric acid solution.

Subsequently, a plurality of the thermoelectric structures 24 are piled up in multiple layers, bonded together, and cut; by forming wiring electrodes 25 on the cut end surfaces, a thermoelectric power generation unit is manufactured.

By the method of manufacturing a thermoelectric power generation unit according to the eighth embodiment, a micro-sized thermoelectric power generation unit can be formed with higher accuracy than by the conventional methods. In addition, the shape and composition of a thermoelectric power generation element (thermocouple) can be controlled with ease.

Furthermore, the method of manufacturing a thermoelectric power generation unit according to the eighth embodiment can be applied to a substrate of larger size because the thermoelectric structures 24 have the heat insulating sheets 18 interposed inbetween.

Ninth Embodiment

The method of manufacturing a thermoelectric power generation unit according to the ninth embodiment of the invention is described hereafter with reference to FIGS. 22 through 25, and FIGS. 30 through 32.

In the ninth embodiment, the manufacturing method is the same as that of the seventh embodiment as shown in FIGS. 22 through 25, to the extent that a copper sheet coated with an insulating film consisting of $SiO_2$ is used for a substrate 10, and succeeding steps of processing comprise forming an electrode film made of titanium on the substrate 10, forming a first electrode film 31 and a second electrode film 32 by patterning, coating with a photosensitive resin 12 and patterning thereon, coating the underside surface of the substrate 10 with a polymer film, forming first thermoelectric bodies 15 and second thermoelectric bodies 17, exfoliating the polymer film from the underside surface of the substrate 10, and applying heat treatment.

Figure 30:
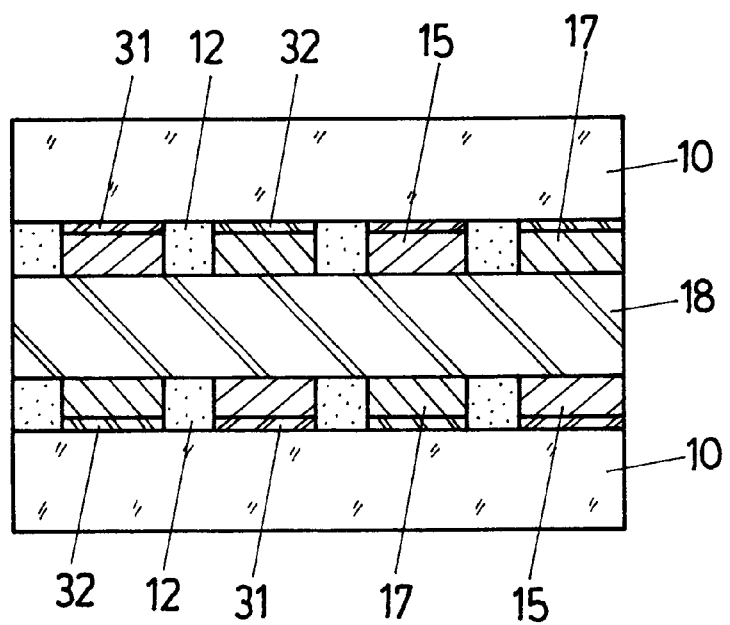
FIGS. 30 to 32 illustrate the manufacturing process adopted in the ninth embodiment according to the invention. Also.

In the next step, as shown in FIG. 30, two substrates, each having the first thermoelectric bodies 15 and the second thermoelectric bodies 17 formed thereon, are bonded together with a heat insulating sheet 18 interposed in-between. For the heat insulating sheet 18, a glass sheet 100 μm in thickness is used.

The two substrates on which the first thermoelectric bodies 15 and the second thermoelectric bodies 17 are formed, are bonded together by a epoxy-based adhesive by disposing respective substrates such that the surface, on which the first thermoelectric bodies 15 and the second thermoelectric bodies 17 are formed, of each substrate faces the heat insulating sheet 18.

Figure 31:
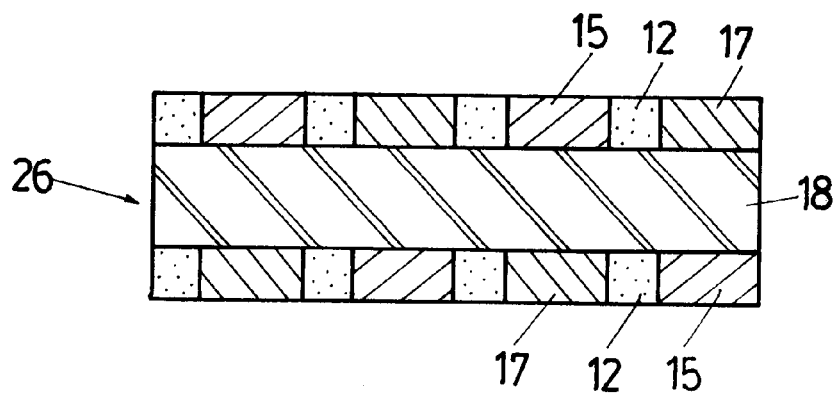

Subsequently, a composite thermoelectric structure 26 as shown in FIG. 31 is formed after dissolving and removing the copper making up the respective substrates 10 by immersing the two substrates entirely in the nitric acid solution, each having the first thermoelectric bodies 15 and the second thermoelectric bodies 17 formed thereon, bonded together with the heat insulating sheet 18 interposed in-between, and then after dissolving the insulating film made of $SiO_2$, and titanium making up the first electrode film 31 and the second electrode film 32, by immersing the two substrates in a 1% hydrofluoric acid solution.

Figure 32:
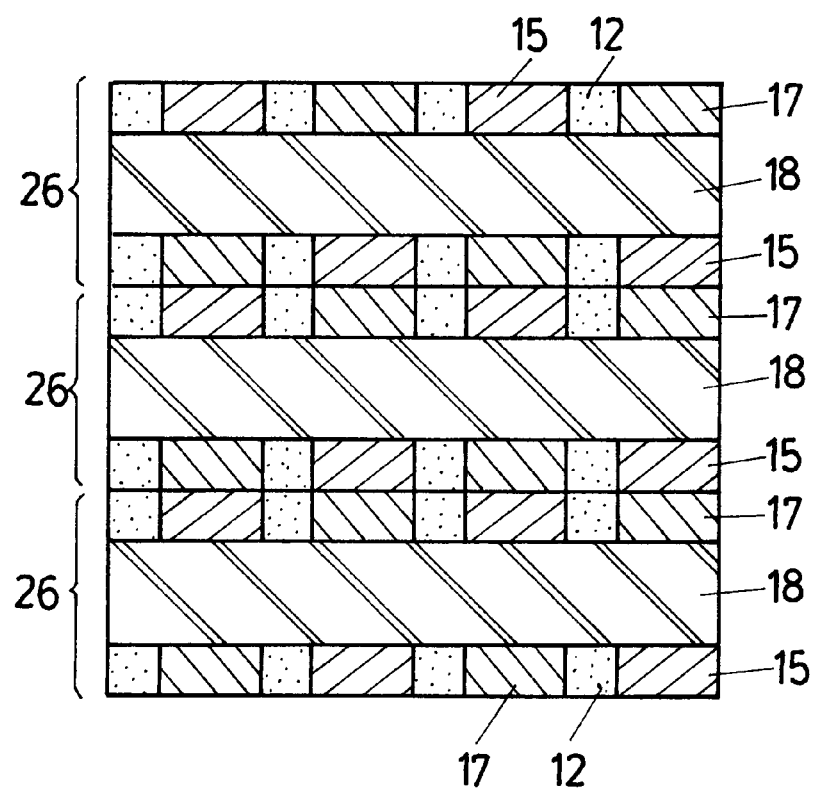

Subsequently, as shown in FIG. 32, a plurality of the composite thermoelectric structures 26 are piled up in multiple layers, bonded together by an epoxy-based adhesive, and cut in a required length.

At this point in time, the first thermoelectric bodies 15 are not electrically connected with the second thermoelectric bodies 17 because respective composite thermoelectric structures 26 are isolated from each other by means of the insulting epoxy-based adhesive used for bonding, although not shown in FIG. 32.

If a surface roughness of the cut surfaces of a thermoelectric power generation element formed as described above is so large as to affect wiring to be provided in a later stage of processing, the cut surfaces of the element may be polished by a lapping method.

As shown in FIG. 28, a gold (Au) film is formed on the entire cut surfaces of the element by a process of vacuum deposition, spattering, or electroless plating; wiring electrodes 25 are formed by patterning on the gold film using photolithographic techniques.

A thermocouple 30 is fabricated by connecting the respective first thermoelectric bodies 15 to the respective thermoelectric bodies 17 appearing on the cut surface, adjacent to each other by the wiring electrodes 25.

By connecting all the thermocouples 30 together in series, a thermoelectric power generation unit is manufactured.

By the method of manufacturing a thermoelectric power generation unit according to the ninth embodiment, a microsized thermoelectric power generation unit can be formed with higher accuracy than by the conventional methods. In addition, the shape and composition of a thermoelectric power generation element can be controlled with ease.

Furthermore, an increase in the hardness of a power generation unit is achieved due to the fact that the heat insulating sheet 18 is interposed between the respective composite thermoelectric structures 26, and as a result, the thickness of the heat insulating sheet 18 can be halved compared to that from same in the case of the eighth embodiment, allowing the thickness of laminated thermoelectric power generation elements to be reduced. Thus, this method is suitable for further miniaturization of a thermoelectric power generation unit.

Tenth Embodiment

The method of manufacturing a thermoelectric power generation unit according to the seventh embodiment of the invention is described hereafter with reference to FIGS. 21 through 25, and FIGS. 33 and 34.

As shown in FIG. 21, a copper sheet with its upper surface coated with an insulating film, for example, a $SiO_2$ film, is used for a substrate 10.

The insulating film made of $SiO_2$ is a film provided to prevent short circuiting between two electrode films to be formed at a later stage of processing caused by copper of the substrate 10.

In the next step, a first electrode film 31 and a second electrode film 32 are formed on the entire upper surface of the substrate 10 by depositing a titanium film 500 nm in thickness by a vacuum deposition process.

Patterning is made on the titanium film using photolithographic techniques and etching techniques such that a plane pattern in the shape substantially resembling teeth of two combs disposed opposite to each other, each tooth mutually interposed, is created, thus forming the first electrode film 31 and the second electrode film 32.

FIG. 22 is a plan view showing the shape of the plane pattern of the first electrode film 31 and the second electrode film 32; the pattern in the shape substantially resembling the teeth of the combs facing each other is so formed as to create a gap region between the first electrode film 31 and the second electrode film 32.

Subsequently, a photosensitive resin 12 is formed on the entire surface of the substrate 10 on which the first electrode film 31 and the second electrode film 32 are provided; as the photosensitive resin 12, a photosensitive dry film 50 µm in thickness is formed by a roll coater.

As shown in FIG. 23, the photosensitive resin 12 is formed in the gap region between the first electrode film 31 and the second electrode film 32 using the photolithographic techniques such that patterning in the shape of stripes is made.

After the photosensitive resin 12 is formed, the underside surface of the substrate 10 is entirely coated with a Teflon-based polymer film using a spin coating process although not shown in FIG. 23.

Subsequently, first thermoelectric bodies 15 made of a first thermoelectric material are formed by means of plating on the first electrode film 31 inside openings of the photosensitive resin 12 as shown in FIG. 25.

A Bi—Te—Se alloy which is an N type semiconductor is used as the material for the first thermoelectric bodies 15 formed on the first electrode film 31.

A plating electrolyte used for forming the first thermoelectric bodies 15 made of an N type semiconductors is a nitric acid solution containing $Bi(NO_3)_3$, $TeO_2$, and $SeO_2$. The Bi—Te—Se alloy is deposited on the first electrode film 31 inside the openings of the photosensitive resin 12 by applying a voltage of 1V between the first electrode film 31 serving as a cathode and a platinum (Pt) electrode serving as an anode.

The thickness of the first thermoelectric bodies 15 is controlled by the quantity of reaction electric charge and set to be substantially the same as that of the photosensitive resin 12, namely 50 µm.

Subsequently, second thermoelectric bodies 17 made of a second thermoelectric material are formed on a second electrode film 32 by means of a plating process.

A Bi—Te—Sb alloy which is a P type semiconductor is used as the material for the second thermoelectric bodies 17.

A plating electrolyte used for forming the second thermoelectric bodies 17 made of a P type semiconductor is a nitric acid solution containing $Bi(NO_3)_3$, $TeO_2$, and $SbCl_3$; the Bi—Te—Sb alloy is deposited on the second electrode film 32 inside the openings 13 provided in the photosensitive resin 12 by applying 1V between the second electrode film 32 serving as a cathode and a platinum (Pt) electrode serving as an anode.

The thickness of the second electrode film 32 is controlled by measuring the quantity of reaction electric charge so that it is the same as that of the photosensitive resin 12, namely, 50 µm.

After applying a plating process twice to form the first thermoelectric bodies 15 and the second thermoelectric bodies 17, the polymer film formed on the underside surface of the substrate 10 is dissolved and removed by toluene. Thereafter, the first thermoelectric bodies 15 and the second thermoelectric bodies 17 are heat treated in a nitrogen atmosphere at 350° C. for one hour.

As shown in FIG. 25, a thermosetting resin 16 consisting of polyimide resin is then formed on the upper surface of the first thermoelectric bodies 15, the second thermoelectric bodies 17, and the photosensitive resin 12 using a spin coating process.

Then, the polyimide resin of the thermosetting resin 16 is hardened by applying heat treatment at a temperature of 150° C. or higher.

All copper making up the substrate 10 is dissolved by immersing a whole body of a thermoelectric structure thus formed in a nitric acid solution.

After the process of dissolving the substrate 10, the first thermoelectric bodies 15, the second thermoelectric bodies 17, the photosensitive resin 12, and the thermosetting resin 16 remain as they are because they are all insoluble in the nitric acid solution.

Figure 33:
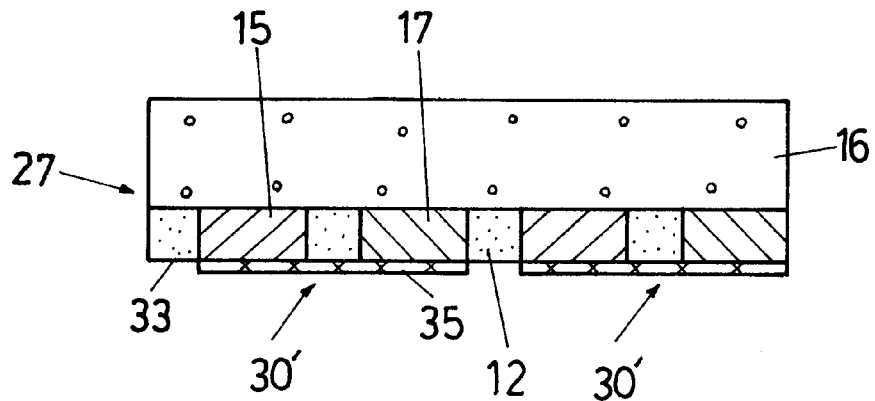
FIGS. 33 and 34 illustrate part of manufacturing process adopted in the tenth and eleventh embodiments according to the invention.

Subsequently, the insulating film consisting of the $SiO_2$ film, and the first electrode film 31 and the second electrode film 32, both consisting of the titanium film, all the films mentioned above having remained until then, are dissolved and removed using a hydrofluoric acid so that a plating initiation surface 33 of the first thermoelectric bodies 15 and the second thermoelectric bodies 17 is exposed as shown in FIG. 33.

Then, a gold (Au) film is formed on the plating initiation surface 33 by the vacuum deposition process, and patterning is provided on the gold film by the photolithographic process and the etching process such that wiring electrodes 35 are formed in such a way as to connect one of the first thermoelectric bodies 15 to one of the second thermoelectric bodies 17, adjacent to the former, alternately, forming a thermocouple 30'. Through the treatments and processes described as above, a thermoelectric structure 27 having many thermocouples is formed.

Thereafter, a plurality of the thermoelectric structures 27 are piled up in multiple layers, and bonded together by an epoxy-based adhesive.

Finally, a thermoelectric power generation unit is manufactured by connecting all the thermocouples 30' together in series.

By the method of manufacturing a thermoelectric power generation unit according to the tenth embodiment, a micro-sized thermoelectric power generation unit can be formed with higher accuracy than by the conventional methods. In addition, the shape and composition of a thermoelectric power generation element (thermocouple) can be controlled with ease.

Eleventh Embodiment

Figure 34:
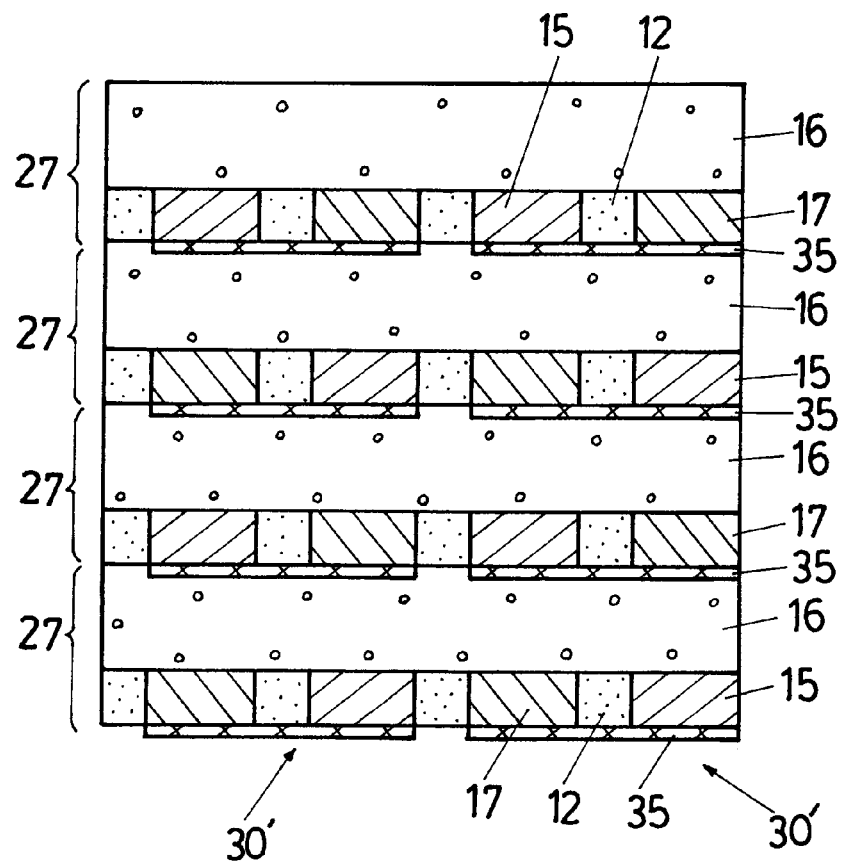

The method of manufacturing a thermoelectric power generation unit according to the eleventh embodiment of the invention is described hereafter with reference to FIGS. 33, 34, and others.

The manufacturing method according to the eleventh embodiment of the invention is the same as that of the tenth embodiment to the extent that a copper sheet with its upper surface coated with an insulating film made of $SiO_2$, is used for a substrate 10, and succeeding steps of processing comprise forming an electrode film made of titanium, forming a first electrode film 31 and a second electrode film 32 by patterning; coating with a photosensitive resin 12 and patterning thereon, coating the underside surface of a substrate 10 with a polymer film, forming first thermoelectric bodies 15 and second thermoelectric bodies 17, exfoliating the polymer film from the underside surface of the substrate 10, and applying heat treatment.

In the next step of processing, the eleventh embodiment differs from the tenth embodiment in that a heat insulating sheet 18 made of glass is used in place of the thermosetting resin 16 as shown in FIG. 29. The heat insulating sheet 18 with thickness of 100 µm is bonded to the upside surfaces of the first thermoelectric bodies 15, the second thermoelectric bodies 17, and the photosensitive resin 12 by an epoxy-based adhesive.

Subsequently, the copper sheet making up the substrate 10 is dissolved in a nitric acid solution and removed; further the insulating film consisting of the $SiO_2$ film, and the first electrode film 31 and the second electrode film 32, both consisting of titanium, are dissolved in a 1% hydrofluoric acid solution, and removed. Then, a gold (Au) film is formed on the plating initiation surface 33, and patterning is made thereon, forming wiring electrodes 35 in the same manner as shown in FIG. 33. Thus, a thermoelectric structure 27 is formed.

Thereafter, a plurality of the thermoelectric structures 27 are piled up in multiple layers, and bonded together, forming a thermocouple in the same manner as shown in FIG. 34 (except that the heat insulating sheet 18 is used in place of the thermosetting resin 16); a thermoelectric power generation unit is manufactured by connecting all the thermocouples together in series.

By the method of manufacturing a thermoelectric power generation unit according to the eleventh embodiment, a micro-sized thermoelectric power generation unit can be formed with higher accuracy than by the conventional methods. In addition, the shape and composition of a thermoelectric power generation element can be controlled with ease.

Furthermore, since the heat insulating sheets 18 are interposed among the plurality of the thermoelectric structures 27, this method can be applied to substrates of larger sizes.

Twelfth Embodiment

Figure 35:
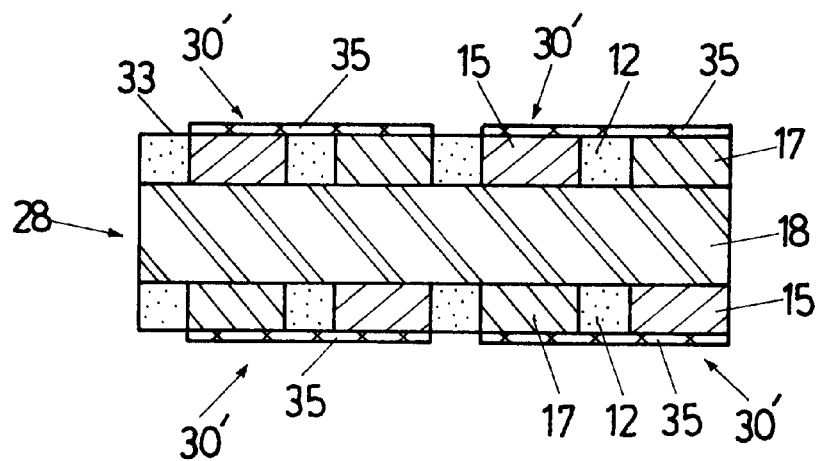
FIGS. 35 and 36 illustrate part of the manufacturing process adopted in the twelfth embodiment according to the invention.
Figure 36:
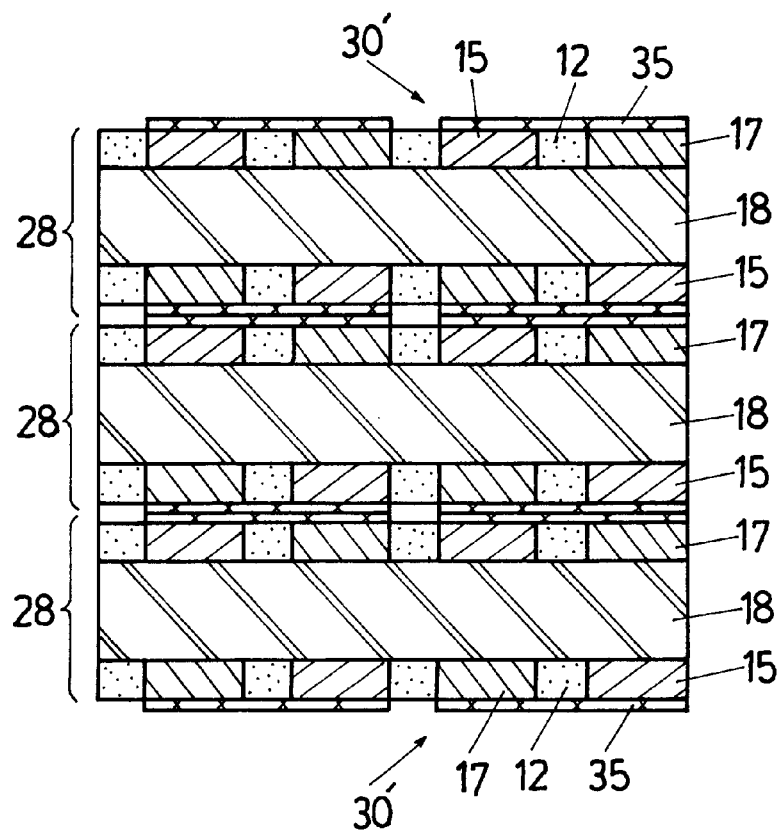

The method of manufacturing a thermoelectric power generation unit according to the twelfth embodiment of the invention is described hereafter with reference to FIGS. 35, 36, and others.

The manufacturing method according to the twelfth embodiment of the invention is the same as that of the tenth embodiment to the extent that a copper sheet with its upper surface coated with an insulating film made of $SiO_2$, is used for a substrate 10, and succeeding steps of processing comprise forming an electrode film made of titanium, forming a first electrode film 31 and a second electrode film 32 by patterning, coating with a photosensitive resin 12 and patterning thereon, coating the underside surface of the substrate 10 with a polymer film, forming first thermoelectric bodies 15 and second thermoelectric bodies 17, exfoliating the polymer film from the underside surface of the substrate 10, and applying heat treatment.

In the next step, as shown in FIG. 30, two substrates, each having the first thermoelectric bodies 15 and the second thermoelectric bodies 17 formed thereon, are bonded together with a heat insulating sheet 18 interposed in-between. For the heat insulating sheet 18, a glass sheet 100 µm in thickness is used.

The two substrates on which the first thermoelectric bodies 15 and the second thermoelectric bodies 17 are formed are bonded together by a epoxy-based adhesive by disposing respective substrates such that the surface, on which the first thermoelectric bodies 15 and the second thermoelectric bodies 17 are formed, of each substrate faces the heat insulating sheet 18.

Subsequently, copper making up the substrate 10 is dissolved and removed by immersing entirely an element comprising the first thermoelectric bodies 15 and the second thermoelectric bodies 17 bonded together with the heat insulating sheet 18 interposed in-between in a nitric acid solution, and then the insulating film made of $SiO_2$ and titanium making up the first electrode film 31 and the second electrode film 32 are dissolved and removed by immersing the element in a 1% hydrofluoric acid solution as shown in FIG. 35.

Then, a gold (Au) film is formed by the vacuum deposition process on the plating initiation surface 33 thus exposed, and patterning is provided on the gold film by the photolithographic process and the etching process such that wiring electrodes 35 are formed in such a way as to connect one of the first thermoelectric bodies 15 to one of the second thermoelectric bodies 17, adjacent to the former, alternately, forming a thermocouple 30'. Through the treatments and processes described as above, a composite thermoelectric structure 28 is formed.

Thereafter, a plurality of the thermoelectric structures 28 are piled up in multiple layers, and bonded together by an epoxy-based adhesive as shown in FIG. 36.

At this stage, the first thermoelectric bodies 15 are not electrically connected to the second thermoelectric bodies 17 as respective composite thermoelectric structures 28 are isolated from each other by means of the epoxy-based adhesive used for bonding.

Finally, a thermoelectric power generation unit is manufactured by connecting all the thermocouples 30' together in series.

By the method of manufacturing a thermoelectric power generation unit according to the twelfth embodiment, a micro-sized thermoelectric power generation unit can be formed with higher accuracy than by the conventional methods. In addition, the shape and composition of a thermoelectric power generation element can be controlled with ease.

Furthermore, an increase in the hardness of a power generation unit is achieved due to the fact that the heat insulating sheet 18 is interposed between the respective composite thermoelectric structures 28, and as a result, the thickness of the heat insulating sheet 18 can be reduced to half that in the case of the eleventh embodiment, allowing the thickness of laminated thermocouples to be reduced. Thus, this method is suitable for further miniaturiation of a thermoelectric power generation unit.

In the foregoing embodiments 1 through 12, a copper sheet or a titanium sheet is used as the material for the substrate 10, however, other materials which will not attack the thermoelectric process materials, dry film or polyimide, but are soluble by the etching process may be substituted for the copper or titanium sheet.

Either metallic materials such as a steel sheet, nickel sheet, galvanized iron sheet, aluminum sheet, brass sheet, and the like or ceramic materials such as a glass sheet, alumina sheet and the like may be used as the material for the substrate 10.

Also, the examples wherein a titanium film is used to form the electrode film 11, the first electrode film 31, or the second electrode film 32 on the substrate 10 are described heretofore. However, other materials for a metallic film if they are insoluble to a plating solution may be substituted for a titanium film used to form the electrode film 11, the first electrode film 31, or the second electrode film 32; Au film, Pt film, Pd film, Ta film or the like is a possible alternative material.

Also, in the first through twelfth embodiments, use of Au film to form the wiring electrodes 25 is described.

However, not only Au film but also other metallic materials such as Cu film, Al film, Ni film, Fe film and the like may be used to form the wiring electrodes 25.

In the foregoing embodiments, the process of forming the wiring electrodes 25 by forming a film first, and patterning thereon by means of the photolithographic techniques and etching techniques, is described. However, another process of forming an electrode pattern by covering first the whole surface except the regions where the electrodes are to be formed with a specified masking material, and then removing a metallic mask after a metallic film is formed on the whole surface, which is called a mask deposition process, may also be applied to the manufacturing method of the invention.

Still, other process of forming the wiring electrodes 25 such as a printing process or a process of pasting on the surface a film which is formed on other material in sheet form and patterned in the shape of the wiring electrodes may be applicable.

Also, in the foregoing embodiments, a photosensitive dry film is used for the photosensitive resin 12 which is required in the course of plating with thermoelectric materials for the first thermoelectric bodies 15 and the second thermoelectric bodies 17, however, a photosensitive polyimide other than the dry film may also be used for the photosensitive resin.

If the thickness in the order of 10 $\mu$m of the first thermoelectric bodies 15 and the second thermoelectric bodies 17, respectively, is sufficient to meet the requirement, a rubber-based photo resist or a cinnamic acid based photo resist may be used for the photosensitive resin required when plating with the thermoelectric materials.

In the foregoing embodiments, use of polyimide for the thermosetting resin 16 is described, however, an epoxy-based adhesive or an acrylic acid resin besides polyimide may also used for the thermosetting resin.

Besides the spin coating process described as the method of forming the thermosetting resin 16, a spray coating process, a roll coating process, a process of pasting a film, or the like may be used.

Also, besides a glass plate used for the heat insulating sheet 18, a ceramic sheet, a plastic sheet, or the like which are low in thermal conductivity, and in thin sheet form, yet highly resistant to deformation may be used for the heat insulating sheet 18.

As for thermoelectric materials, Bi—Te—Se alloy is used for the N type semiconductor, and Bi—Te—Sb alloy for the P type semiconductor in the foregoing embodiments. However, the N type semiconductor and the P type semiconductor may be produced by varying the ratio of concentration of Bi to that of Te without mixing in either Se or Sb.

Also, materials other than the aforesaid may be used as the thermoelectric materials for forming the first thermoelectric bodies 15 and the second thermoelectric bodies 17 if the materials are suited for deposition by plating.

Thirteenth Embodiment

The method of manufacturing a thermoelectric power generation unit according to the thirteenth embodiment of the invention is described hereafter with reference to FIGS. 37 through 45.

Figure 37:
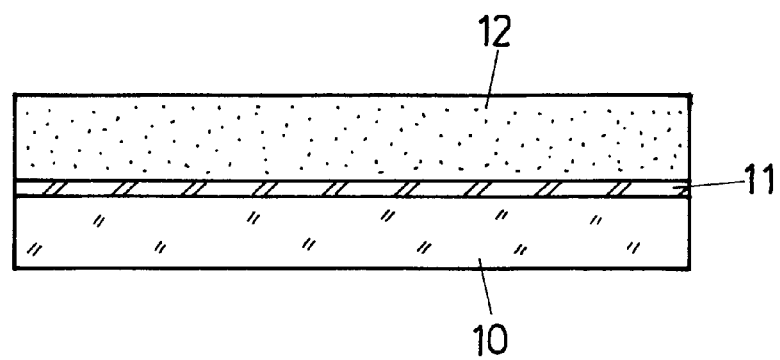
FIGS. 37 to 45 illustrate the manufacturing process adopted in a thirteenth embodiment according to the invention.

Firstly, as shown in FIG. 37, a copper sheet is used to form a substrate 10, and an electrode film 11 is formed on the entire surface of the substrate 10 by forming a titanium (Ti) film 500 nm in thickness by a vacuum deposition process.

The electrode film 11 consisting of the titanium film is to protect the copper sheet making up the substrate 10 from being attacked by a plating solution during the process described hereafter.

Then, two layers of photosensitive dry film, each 50 μm thick, are formed as a photosensitive resin 12 on the substrate 10 by roll coater so that the total thickness of the photosensitive resin 12 will be 100 μm.

Thereafter, using the photolithographic techniques, a combination of so-called exposure treatment with so-called development treatment, whereby through a photo mask a photosensitive film is irradiated and exposed to light so that only unexposed regions are dissolved and removed, patterning in the shape of stripes is provided on the photosensitive resin 12 consisting of the dry film as shown in FIG. 1, forming a photosensitive resin 12a having a first pattern in the shape of stripes.

The photosensitive resin 12a having a pattern in the shape of stripes forms openings, on the electrode film 11, namely the areas dissolved and removed by means of the photolithographic techniques, and unopened surface areas, namely the areas not dissolved and removed as yet by means of the photolithographic techniques.

Figure 44:
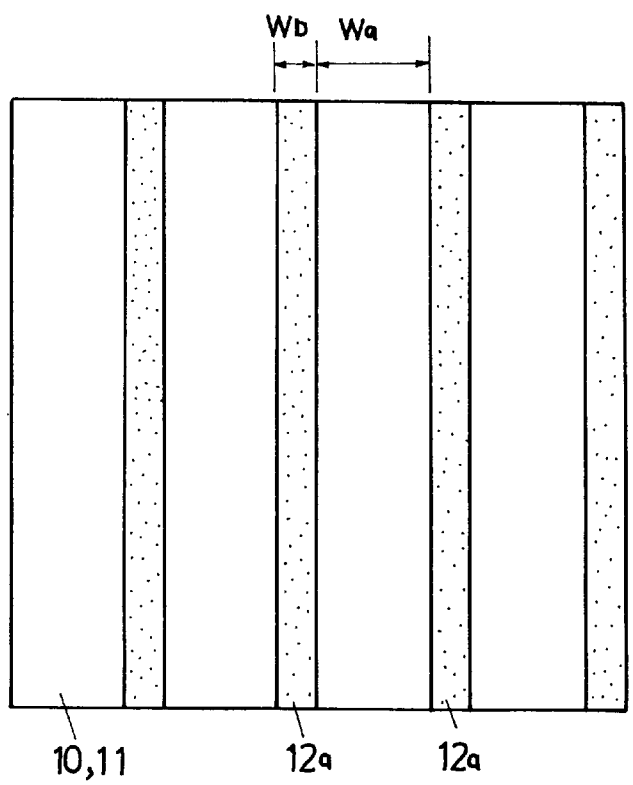

As shown in FIG. 44, the first pattern in the shape of stripes is formed such that the width Wa of respective openings of the photosensitive resin 12a is larger than the width Wb of respective unopened surface areas thereof, in other words, Wa is 150 μm whereas Wb is 50 μm.

Figure 38:
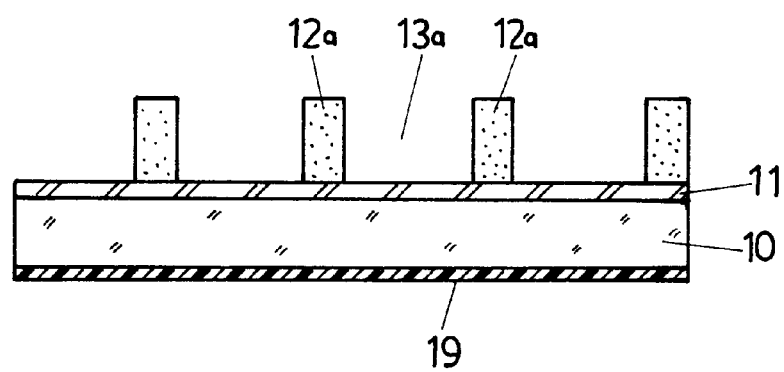

After patterning on the photosensitive resin 12 as shown in FIG. 37, a Teflon-based polymer film 19 is formed on the entire underside surface of the substrate 10 using a spin coating process as shown in FIG. 38.

The polymer film 19 is formed on the underside surface of the substrate 10 to prevent metallic deposit by plating from being formed on the underside surface of the substrate 10 at a later stage of processing.

Figure 39:
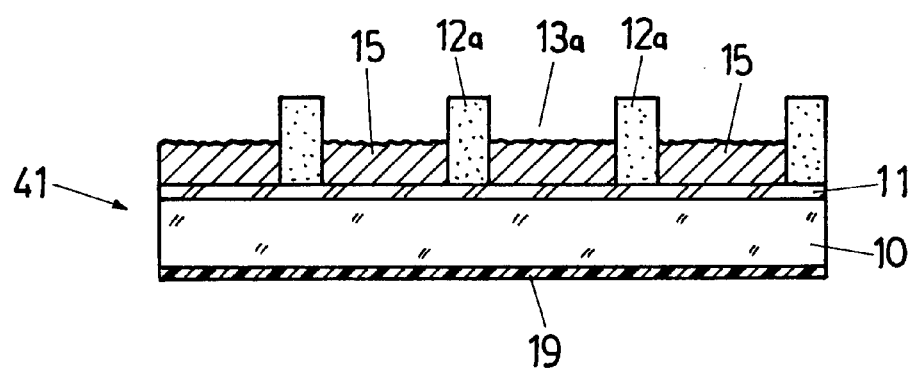

Subsequently, as shown in FIG. 39, first thermoelectric bodies 15 made of a first thermoelectric material are formed inside the openings 13a of the photosensitive resin 12a by means of a plating process.

A Bi—Te—Se alloy which is an N type semiconductor is used as the material for the first thermoelectric bodies 15.

As a plating electrolyte, a nitric acid solution containing $Bi(NO_3)_3$, $TeO_2$, and $SeO_2$ is used. The first thermoelectric bodies 15 consisting of the Bi—Te—Se alloy is deposited on the electrode film 11 inside the openings 13a of the photosensitive resin 12a by applying a voltage of 1V between the electrode film 11 serving as a cathode and a platinum (Pt) electrode serving as an anode.

During the plating process, the underside of the substrate 10 is protected by the polymer film 19. Accordingly, the first thermoelectric bodies 15 are deposited only inside the openings 13a of the photosensitive resin 12a.

In a plating process, the amount of metallic deposit is determined by the quantity of electric charge which can be calculated from electric current consumed during the time when electrolysis is underway. Therefore, the thickness of the first thermoelectric bodies 15 is controlled with ease by measuring the quantity of electric charge.

In this case, the thickness of the first thermoelectric bodies 15 is set to be a half of the thickness of the photosensitive resin 12a already formed by patterning, namely 50 μm.

Furthermore, the chemical composition of the alloy making up the first thermoelectric bodies 15 can be changed by varying the ion concentration of Bi, Te, and Se, respectively. Accordingly, a material that can produce a required output voltage and was a low resistance is selected by adjusting the setting condition described as above. Thus a thermoelectric structure 41 as shown in FIG. 39 is formed.

Figure 40:
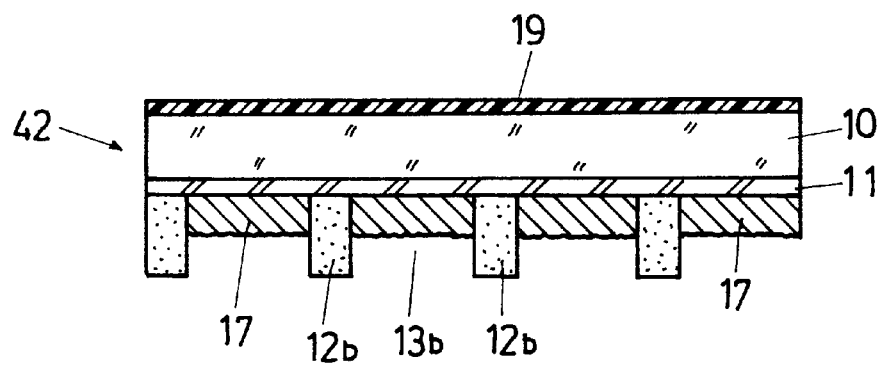

By applying a substantially same treatment process as applied in the method of manufacturing the first thermoelectric structure 41, a second thermoelectric structure 42 is formed as shown in FIG. 40.

Hereafter, a process of forming the second thermoelectric structure 42 is described primarily in the area where it differs from the process of forming the first thermoelectric structure 41.

The process of forming the second thermoelectric structure 42 is the same as that of the first thermoelectric structure 41 as described with reference to FIGS. 37, 38, and 44 up to a point where patterning in the shape of stripes is made on the photosensitive resin, and the polymer film is formed.

In the process of forming the second thermoelectric structure 42, patterning on a photosensitive resin 12b, namely a second pattern in the shape of stripes, is made such that the second pattern in the shape of stripes is identical with the first pattern in the shape of stripes on the photosensitive resin 12a in respect of the width of the respective openings, Wa, the width of respective unopened surface areas, Wb, and the thickness.

Thus, the dimensions of the second pattern in the shape of stripes on the photosensitive resin 12b being the same as that of the first pattern in the shape of stripes, the first thermoelectric structure 41 and the second thermoelectric structure 42 have elements necessary for production in common, contributing to improved productivity in manufacturing thermoelectric power generation units.

In addition, since the second pattern in the shape of stripes provided on the photosensitive resin 12b is made identical with the first pattern in the shape of stripes on the photosensitive resin 12a, the first thermoelectric structure 41 can fit snugly into the second thermoelectric structure 42 as described hereafter, enabling processing to proceed without a hitch, and achieving higher efficiency in manufacturing thermoelectric power generation units.

The process of forming the second thermoelectric structure 42 differs from that for the first thermoelectric structure 41 in respect to a process of plating with the thermoelectric material for the second thermoelectric bodies 17, which is described hereafter.

After completion of the same process as shown in FIG. 38, the second thermoelectric bodies 17 made of a second thermoelectric material are formed by a plating process inside openings 13b of the photosensitive resin 12b having the second pattern in the shape of stripes, as shown in FIG. 40. A Bi—Te—Sb alloy, which is a P type semiconductor, is used for forming the second thermoelectric bodies 17.

A nitric acid solution containing $Bi(NO_3)_3$, $TeO_2$, and $SbCl_3$ is used as a plating electrolyte. Each of the second thermoelectric bodies 17 consisting of the Bi—Te—Sb alloy is deposited on the electrode film 11 inside one of the openings 13b provided in the photosensitive resin 12b by applying 1V between the electrode film 11 serving as a cathode and a platinum (Pt) electrode serving as an anode.

As the rear surface of the substrate 10 is protected by the polymer film 19, the second thermoelectric bodies 17 are deposited only inside the openings 13b of the photosensitive resin 12b. The thickness of the second thermoelectric bodies 17 is controlled by measuring the quantity of reaction electric charge so that it is half of the thickness of the photosensitive resin 12b, namely 50 μm.

Furthermore, the chemical composition of the alloy making up the second thermoelectric bodies 17 can be changed by varying the ion concentration of Bi, Te, and Sb, respectively, enabling the properties of the alloy to be controlled so that it can produce a required output voltage, and has a low resistance.

By the treatment process described as above, a second thermoelectric structure 42 comprising the second thermoelectric bodies 17 formed on the substrate 10 is formed.

Figure 41:
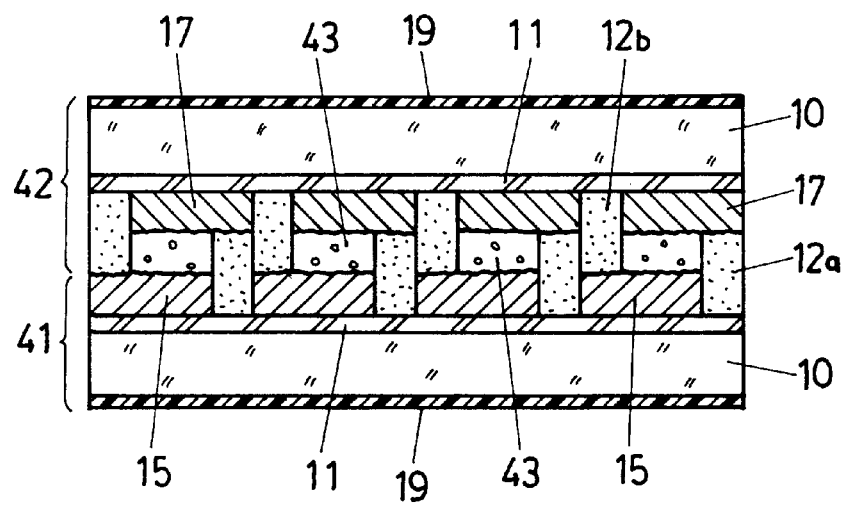

Subsequently, as shown in FIG. 41, a pair of the first thermoelectric structure 41 and the second thermoelectric structure 42 are bonded together by an epoxy-based adhesive 43 such that the surface of the respective structures on which the photosensitive resin 12a and 12b is formed faces each other.

The aforesaid bonding is carried out such that the unopened surface areas of the photosensitive resin 12a formed on the surface of the first thermoelectric structure 41 fit onto the upper surface of the second thermoelectric bodies 17.

By bonding as shown in FIG. 41, the unopened surface areas of the photosensitive resin 12b formed on the surface of the second thermoelectric structure 42 fit onto the upper surfaces of the first thermoelectric bodies 15. Thus, a structure is formed wherein the relative position of the first thermoelectric bodies 15 and the second thermoelectric bodies 17 is kept within a fixed spacing, facilitating a process of wiring among the thermoelectric bodies to be applied at a later stage.

As is evident from FIG. 41, the first thermoelectric bodies 15 and the second thermoelectric bodies 17 are mutually out of contact with each other, and electrically insulated from each other until wiring is provided at a later stage of processing.

After bonding the first thermoelectric structure 41 to the second thermoelectric structure 42 as described above, the polymer film 19 is exfoliated and removed from the underside surface of the substrate 10 using toluene. Then, the first thermoelectric structure 41 and the second thermoelectric structure 42, in a combined state, are heat treated in a nitrogen atmosphere at a temperature of 350° C. for one hour.

The heat treatment in a nitrogen atmosphere is applied to homogenize the chemical composition of the alloys making up the first thermoelectric bodies 15 and the second thermoelectric bodies 17, which will contribute to enhanced output of a thermoelectric power generation element.

Although the heat treatment in a nitrogen atmosphere is applied at a high temperature, the magnitude of deformation such as thermal contraction occurring to the photosensitive resins 12a and 12b after patterning is minimal, causing no practical problem provided that an exposure treatment is applied to the photosensitive resin 12 with light of sufficient intensity when applying a patterning treatment to the photosensitive resin 12 as shown in FIG. 37.

The thermoelectric power generation element comprising the first thermoelectric structure 41 combined with the second thermoelectric structure 42 is cut in a required length.

When the surface roughness of the cut end surfaces of the aforesaid element is so large or cracks appear at bonded interfaces due to insufficient use of the adhesive 43 as to affect wiring at a later stage of processing, the cut end surfaces may be polished by a lapping process or the like.

In particular when cracks occur at the bonded interfaces due to insufficient use of the adhesive 43, the cut end surfaces may be polished by a lapping process after filling up the cracks at the bonded interfaces with an insulating resin such as an epoxy resin.

Subsequently, all copper making up the substrate 10 is dissolved by immersing the element entirely in a nitric acid solution, and then titanium making up the electrode film 11 is dissolved and removed by using an hydrofluoric acid solution.

After the dissolution treatment, the first thermoelectric bodies 15, the second thermoelectric bodies 17, the adhesive 43, and the photosensitive resins 12a and 12b remain as they are because they are all insoluble in the nitric acid and the hydrofluoric acid.

Figure 42:
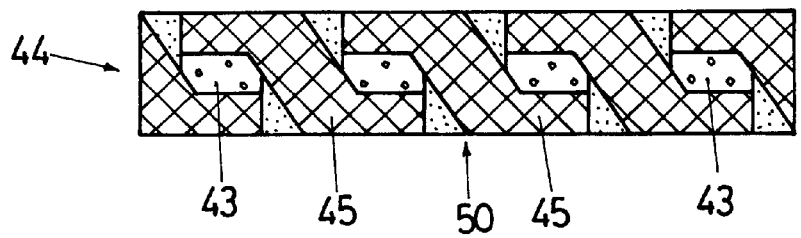

A gold (Au) film is formed on the entire surface at each of the cut ends of the element by a vacuum deposition process, a spattering process, or a electroless plating process. Then, as shown in FIG. 42, wiring electrodes 45 are formed through patterning of the gold film by the photolithographic techniques, forming a synthetic thermoelectric structure 44.

Each of the first thermoelectric bodies 15 will be connected by respective wiring electrodes 45 to one of the second thermoelectric bodies 17 which is formed opposite to the former on the surface at the cut end, forming a thermocouple 50.

As described in the foregoing, all the thermoelectric bodies, being disposed at a predetermined spacing inside each of the synthetic thermoelectric structures 44, can be connected en bloc without erroneous wiring by the wiring electrodes 45.

Figure 43:
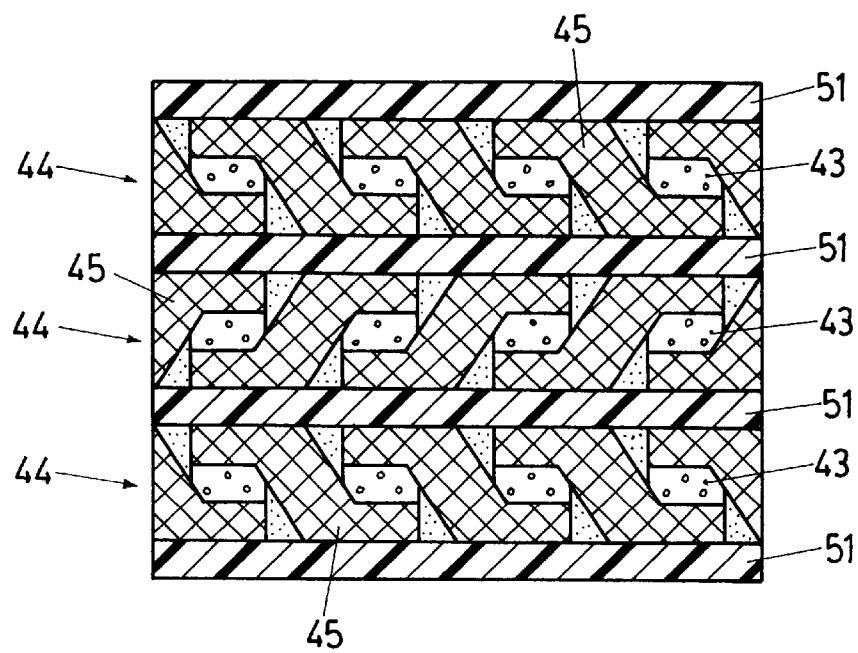

As shown in FIG. 43, a plurality of the synthetic thermoelectric structures 44 are stacked in alternating layers such that each of the first thermoelectric bodies 15 of one of the synthetic thermoelectric structures 44 is disposed opposite to each of the second thermoelectric bodies 17 of another synthetic thermoelectric structure 44 (see FIG. 41) via a flat insulator 51 in sheet form consisting of acrylic resin, and bonded together by an epoxy-based adhesive.

The insulator 51 is used to prevent the first thermoelectric bodies 15 from coming in electrical contact with the second thermoelectric bodies 17 (see FIG. 41), and also to increase the mechanical strength of a thermoelectric power generation unit as a whole. The insulator 51 is formed to have a thickness of 50 $\mu$m.

Figure 45:
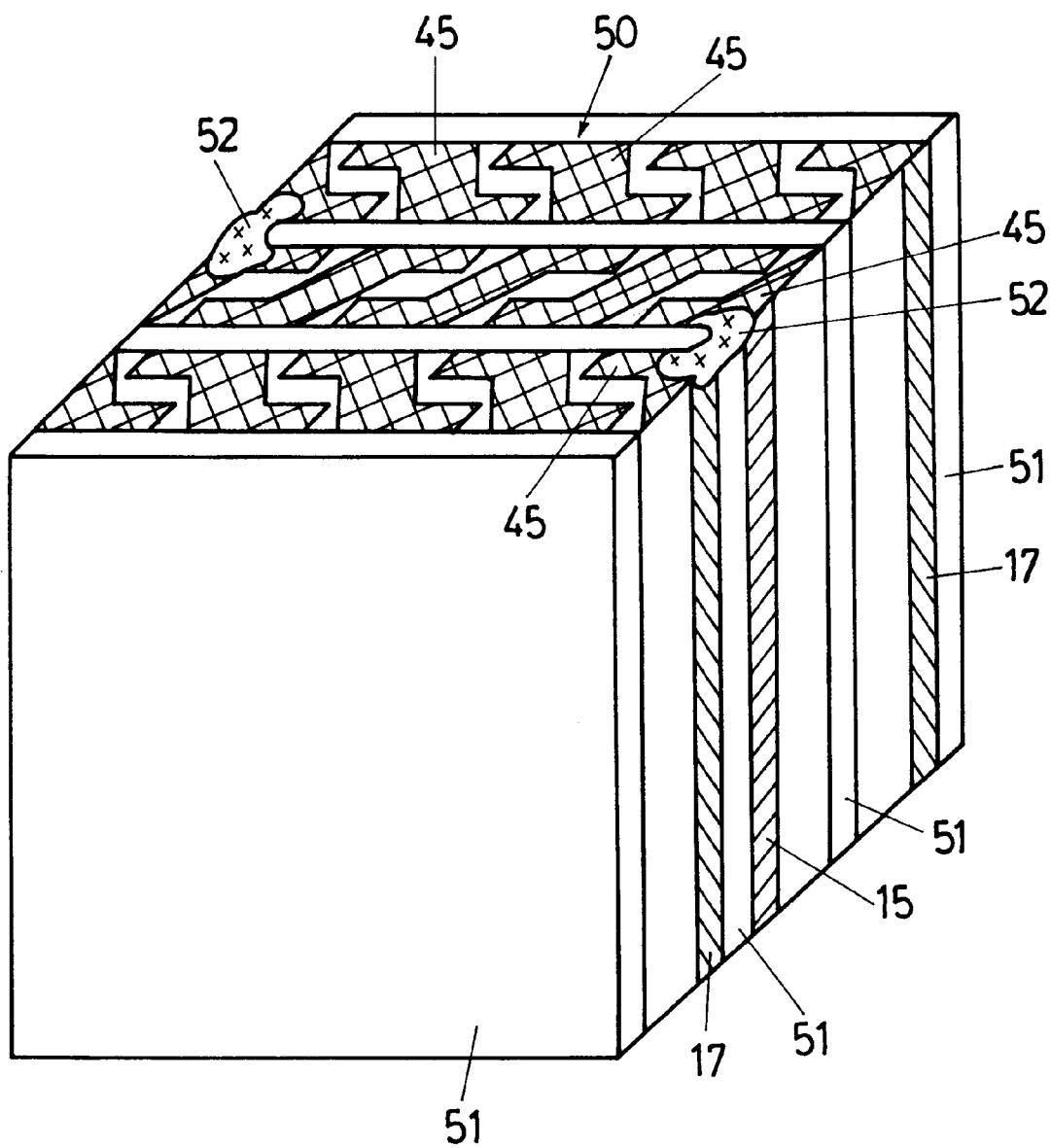
Figure 4:
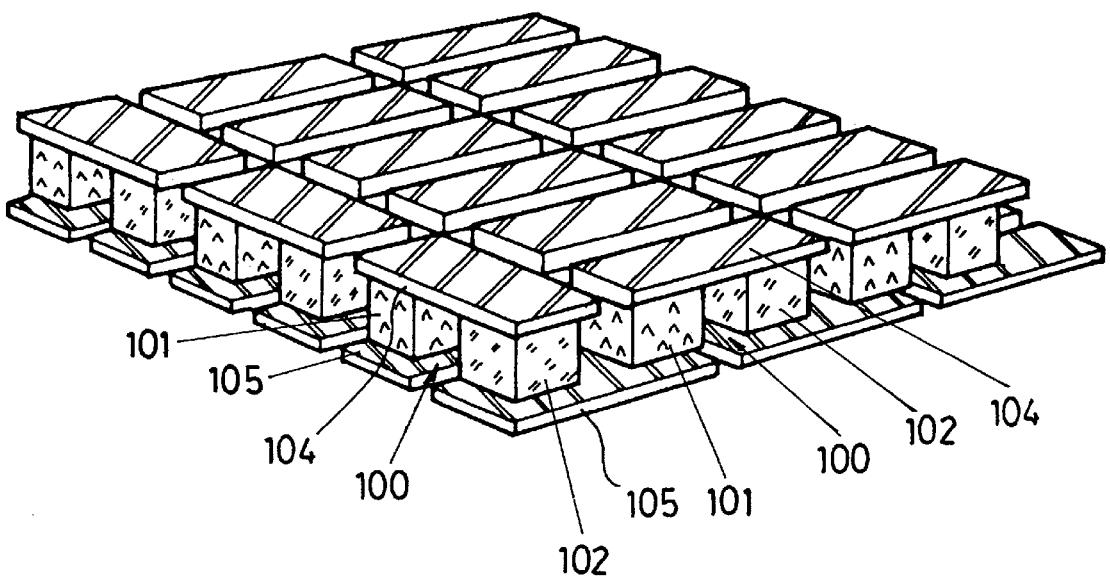

In the next step, as shown in FIG. 45, element terminal wirings 52 are formed along respective edges of the surface at both cut ends of each of the synthetic thermoelectric structures 44 using a conductive adhesive. A wire formed by a wire bonding process may be used for the element terminal wiring 52.

All the thermocouples 50 are connected together in series by connecting the edges of the respective first thermoelectric bodies 15 to those of the respective second thermoelectric bodies 17, both of the bodies being incorporated in the respective synthetic thermoelectric structures 44, with the respective element terminal wiring 52, thus forming a thermoelectric power generation unit.

The element terminal wirings 52 described above can be provided with ease since the element terminal wirings 52 does not require so much precision as that required in the case of forming the wiring electrodes 45 for wiring of the thermoelectric bodies in the aforesaid step of processing.

In the method of manufacturing a thermoelectric power generation unit, patterning can be provided with a precision of plus or minus several $\mu$m on the dry film making up the photosensitive resin 12 formed by photolithographic techniques.

Equally, the first thermoelectric bodies 15 and the second thermoelectric bodies 17 can be formed with a precision of plus or minus several $\mu$m along the surface of the photosensitive resin 12a and 12b, respectively.

Such precision as described above represents a remarkable high precision in comparison with that in the case of the thick film method wherein coating is applied by the conventional mechanical working process, or the printing process. Furthermore, the thickness and chemical composition of the thermoelectric bodies formed by the plating process can be controlled with ease, and a preprocessing treatment of only dissolving process materials is simpler than that for the conventional processes.

The methods of manufacturing a thermoelectric power generation unit as described in the foregoing comprise a photolithographic process, plating process, film forming process, and etching process, all of which can be applied on a batch basis. Therefore, these have an advantage of their capability to fabricate a plurality of the elements simultaneously.

As stated in the foregoing, the thermoelectric power generation unit manufactured by the methods described as above comprises the thermoelectric bodies, each having a width of 150 $\mu$m, disposed at spacings of 50 $\mu$m, and has a total thickness of 150 $\mu$m including the insulator 51.

Assuming that the width of the substrate 10 is 1 cm, and the thickness of the whole body of a layered structure is 7.5 cm, the number of the thermocouples which can be formed on the substrate 10 will amount to 2500 couples.

When a difference in temperature of 2° C. is applied to the thermoelectric element, an open circuit voltage of about 2V is outputted, which is a sufficient output voltage to drive a portable electronic equipment as represented by a wrist watch.

Assuming that a length of the thermoelectric power generation element is 2 mm, the internal impedance will become about 13 k$\Omega$, demonstrating that it is of an order with which an electronic equipment can cope easily.

In this embodiment, a copper sheet is used as the material for the substrate 10, however, other materials which will not attack the thermoelectric process materials, dry film, or polyimide, but are soluble by the etching process may be substituted for the copper.

Use of metallic materials such as a steel sheet, nickel sheet, galvanized iron sheet, aluminum sheet, titanium sheet, brass sheet or the like is considered for use in the substrate 10. Also, ceramic materials such as a glass sheet, alumina sheet or the like may be used as the material for the substrate 10.

Other metallic films other than a titanium film if they are made of materials insoluble to a plating solution may be substituted for the electrode film 11 consisting of a titanium film and formed on the substrate 10.

A gold (Au) film, a platinum (Pt) film, a palladium (Pd) film, a tantalum (Ta) film or the like are prospective alternative materials.

Not only an Au film but also other metallic films may also be used to form the wiring electrodes 45.

As for the material of the wiring electrode 45, a copper (Cu) film, a Nickel (Ni) film, or an iron (Fe) film, etc., are applicable for the wiring electrode 45.

For forming the wiring electrodes 45, a printing process or a process of pasting the electrodes patterned on the surface of other material in sheet form may be applicable.

Furthermore, for forming the element terminal wirings 52, a process of forming a metallic film by vacuum deposition, sputtering, printing, or a process of pasting the electrodes patterned on the surface of other material in sheet form may be applicable.

In the embodiments of the invention, the photosensitive dry film is used as frame members when plating with the thermoelectric materials. Besides the dry film, photosensitive polyimide may also be used for the same purpose. In addition, if the necessary thickness of metallic deposit by plating is in the order of 10 $\mu$m only, rubber-based photo resist or cinnamic acid based photo resist may be used.

Besides the acrylic resin described in the foregoing, a material which is electrically insulating, low in thermal conductivity, and able to maintain with ease a difference in temperature occurring at the thermoelectric-couples may be used to form the insulator 51. An epoxi resin may be use for the insulator 51.

Although, in this embodiment, the thickness of the thermoelectric bodies is set to be a half of that of the photosensitive resin, the thickness of respective thermoelectric bodies may be selectable within the range where the thickness of the thermoelectric bodies is less than that of the photosensitive resin provided that the first thermoelectric structures 41 and the second thermoelectric structures 42 can fit into each other snugly.

INDUSTRIAL APPLICABILITY

By the method of manufacturing a thermoelectric power generation unit according to the invention, a micro-sized thermoelectric power generation unit capable of producing a sufficient output voltage can be manufactured with ease and high precision.

As a result, the thermoelectric power generation unit can be used extensively as a power supply source for a micro-sized portable electronic equipment, for example, a wrist watch.

What is claimed is:

1. A method of manufacturing a thermoelectric power generation unit, the methods comprising:

a first thermoelectric structure forming process comprising steps of:
   forming an electrode film made of a metallic material on a substrate,
   providing a pattern in the shape of stripes on the electrode film using a photosensitive resin,
   forming first thermoelectric bodies consisting of a first thermoelectric material by means of plating within openings provided in the photosensitive resin using the electrode film,
   coating the photosensitive resin and the first thermoelectric bodies with a thermosetting resin, and
   dissolving and removing the substrate and the electrode film;

a second thermoelectric structure forming process comprising the steps of:
   forming an electrode film consisting of a metallic material on a substrate other than the aforesaid substrate,
   providing a pattern in the shape of stripes on the electrode film using a photosensitive resin,
   forming second thermoelectric bodies consisting of a second thermoelectric material by means of plating within openings provided in the photosensitive resin using the electrode film,
   coating the photosensitive resin and the second thermoelectric body with a thermosetting resin, and
   dissolving and removing the substrate and the electrode film; and connecting a plurality of thermocouples in series as a thermoelectric power generation element by a process comprising steps of:
   bonding together a plurality of the first thermoelectric structures and the second thermoelectric structures laid in alternating layers,
   cutting the first and second thermoelectric structures in a predetermined length, and
   connecting the surface at the cut end of each of the first thermoelectric bodies to the surface at the cut end of one of the second thermoelectric bodies, adjacent to the former, alternately with wiring electrodes.

2. A method of manufacturing a thermoelectric power generation unit, the method comprising:

a first thermoelectric structure forming process comprising steps of:
forming an electrode film consisting of a metallic material on a substrate, providing a pattern in the shape of stripes on the electrode film using a photosensitive resin,
forming first thermoelectric bodies consisting of a first thermoelectric material by means of plating within openings provided in the photosensitive resin using the electrode film,
bonding a heat insulating sheet onto the photosensitive resin and the first thermoelectric bodies, and
dissolving and removing the substrate and the electrode film;

a second thermoelectric structure forming process comprising steps of:
forming an electrode film consisting of a metallic material on a substrate other than aforesaid substrate,
providing a pattern in the shape of stripes on the electrode film using a photosensitive resin,
forming second thermoelectric bodies consisting of a second thermoelectric material by means of plating within openings provided in the photosensitive resin using the electrode film,
bonding a heat insulating sheet onto the photosensitive resin and the second thermoelectric bodies, and
dissolving and removing the substrate and the electrode film; and connecting a plurality of thermocouples in series as a thermoelectric power generation element by a process comprising steps of:
bonding together a plurality of the first thermoelectric structures and the second thermoelectric structures laid in alternating layers,
cutting the first and second thermoelectric structures in a predetermined length; and
connecting the surface at the cut end of each of the first thermoelectric bodies to the surface at the cut end of one of the second thermoelectric bodies, adjacent to the former, alternately with wiring electrodes.

3. A method of manufacturing a thermoelectric power generation unit, the method comprising:

a first thermoelectric bodies forming process comprising steps of:
forming an electrode film consisting of a metallic material on a substrate, providing a pattern in the shape of stripes on the electrode film using a photosensitive resin, and
forming first thermoelectric bodies consisting of a first thermoelectric material by means of plating within openings provided in the photosensitive resin using the electrode film;

a second thermoelectric bodies forming process comprising steps of:
forming an electrode film consisting of a metallic material on a substrate other than aforesaid substrate,
providing a pattern in the shape of stripes on the electrode film using a photosensitive resin, and
forming second thermoelectric bodies consisting of a second thermoelectric material by means of plating within openings provided in the photosensitive resin using the electrode film;

a composite thermoelectric structure forming process comprising steps of:
bonding the surface of the first thermoelectric bodies formed on one of the substrates to the surface of the second thermoelectric bodies formed on the other of the substrates with a heat insulating sheet interposed in-between,
dissolving and removing both of the substrates and respective electrode films; and connecting a plurality of thermocouples in series as a thermoelectric power generation element by a process comprising steps of:
bonding together a plurality of the composite thermoelectric structures laid in alternating layers,
cutting the plurality of composite thermoelectric structures in a predetermined length, and
connecting the surface at the cut end of each of the first thermoelectric bodies to the surface at the cut end of one of the second thermoelectric bodies, adjacent to the former, alternately with wiring electrodes.

4. A method of manufacturing a thermoelectric power generation unit, the method comprising:

a first thermoelectric structure forming process comprising steps of:
providing a pattern in the shape of stripes on an electrically conductive substrate using a photosensitive resin,
forming first thermoelectric bodies consisting of a first thermoelectric material by means of plating within openings provided in the photosensitive resin using the substrate as an electrode,
coating the photosensitive resin and the first thermoelectric bodies with a thermosetting resin, and
dissolving and removing the substrate;

a second thermoelectric structure forming process comprising the steps of:
providing a pattern in the shape of stripes on an electrically conductive substrate other than the aforesaid substrate using a photosensitive resin,
forming second thermoelectric bodies consisting of a second thermoelectric material by means of plating within openings provided in the photosensitive using the substrate as an electrode,
coating the photosensitive resin and the second thermoelectric bodies with a thermosetting resin, and
dissolving and removing the substrate; and connecting a plurality of thermocouples in series as a thermoelectric power generation element by a process comprising steps of:
bonding a plurality of the first thermoelectric structures to a plurality of the second thermoelectric structures laid in alternating layers,
cutting the plurality of the first and second thermoelectric structures bonded together in a predetermined length, and
connecting the surface at the cut end of each of the first thermoelectric bodies to the surface of one of the second thermoelectric bodies, adjacent to the former, alternately with wiring electrodes.

5. A method of manufacturing a thermoelectric power generation unit, the method comprising:

a first thermoelectric structure forming process comprising steps of:
providing a pattern in the shape of stripes on an electrically conductive substrate using a photosensitive resin, forming first thermoelectric bodies consisting of a first thermoelectric material by means of plating within openings provided in the photosensitive resin using the substrate as an electrode, bonding a heat insulating sheet onto the photosensitive resin and the first thermoelectric bodies, and dissolving and removing the substrate;

a second thermoelectric structure forming process comprising steps of:

providing a pattern in the shape of stripes on an electrically conductive substrate other than the aforesaid substrate using a photosensitive resin, forming second thermoelectric bodies consisting of a second thermoelectric material by means of plating within openings provided in the photosensitive using the substrate as an electrode, bonding a heat insulating sheet onto the photosensitive resin and the second thermoelectric bodies dissolving, and removing the substrate; and connecting a plurality of thermocouples in series as a thermoelectric power generation element by a process comprising the steps of:

bonding a plurality of the first thermoelectric structures to a plurality of the second thermoelectric structures laid in alternating layers, cutting the plurality of the first and second thermoelectric structures bonded together in a predetermined length, and connecting the surface at the cut end of each of the first thermoelectric bodies to the surface of one of the second thermoelectric bodies, adjacent to the former, alternately with wiring electrodes.

6. A method of manufacturing a thermoelectric power generation unit, the method comprising:

a first thermoelectric bodies forming process comprising steps of:

providing a pattern in the shape of stripes on an electrically conductive substrate using a photosensitive resin, and forming first thermoelectric bodies consisting of a first thermoelectric material by means of plating within openings provided in the photosensitive resin using the substrate as an electrode;

a second thermoelectric bodies forming process comprising steps of:

providing a pattern in the shape of stripes on an electrically conductive substrate other than the aforesaid substrate using a photosensitive resin, and forming second thermoelectric bodies consisting of a second thermoelectric material by means of plating within openings provided in the photosensitive resin using the substrate as an electrode;

a composite thermoelectric structure forming process comprising steps of:

bonding the surface of the first thermoelectric bodies formed on the substrate to the surface of the second thermoelectric bodies formed on the other substrate with a heat insulating sheet interposed in-between, and forming a composite thermoelectric structure by a step of dissolving and removing both of aforesaid substrates; and connecting a plurality of thermocouples in series as a thermoelectric power generation element by a process comprising steps of:

bonding together a plurality of the composite thermoelectric structures laid in layers, cutting the composite thermoelectric structures bonded together in a predetermined length, and connecting the surface at the cut end of each of the first thermoelectric bodies to the surface at the cut end of one of the second thermoelectric bodies, adjacent to the former, alternately with wiring electrodes.

7. A method of manufacturing a thermoelectric power generation unit, the method comprising:

a thermoelectric structure forming process comprising steps of:

forming a metallic film on a substrate whose surface or whole body has insulation properties, forming the metallic film by etching into a first electrode film and a second electrode film, formed in the shape of teeth of two combs facing each other, each tooth being alternately interposed between adjacent teeth, forming a pattern in the shape of stripes on a photosensitive resin in the gap area between the first electrode film and the second electrode film, each in the shape of teeth of a comb, forming first thermoelectric bodies consisting of a first thermoelectric material by plating on the first electrode film inside openings of the photosensitive resin, forming second thermoelectric bodies consisting of a second thermoelectric material by plating on the second electrode film inside openings of the photosensitive resin, coating the photosensitive resin, the first thermoelectric bodies, and the second thermoelectric bodies with a thermosetting resin, and dissolving and removing the substrate, first electrode film, and second electrode film; and connecting a plurality of thermocouples in series as a thermoelectric power generation element by a process comprising the steps of:

stacking and bonding together a plurality of the thermoelectric structures, cutting the plurality of the thermoelectric structures bonded together in a predetermined length, and connecting the surface at the cut end of each of the first thermoelectric bodies to the surface at the cut end of one of the second thermoelectric bodies, adjacent to the former, alternately by wiring electrodes.

8. A method of manufacturing a thermoelectric power generation unit, the method comprising:

a thermoelectric structure forming process comprising steps of:

forming a metallic film on a substrate whose surface or whole body has insulation property, forming the metallic film by etching into a first electrode film and a second electrode film, formed in the shape of teeth of two combs facing each other, each tooth being alternately interposed between adjacent teeth;

forming a pattern in the shape of stripes on a photosensitive resin in the gap area between the first electrode film and the second electrode film, each in the shape of teeth of a comb, forming first thermoelectric bodies consisting of a first thermoelectric material by plating on the first electrode film inside openings of the photosensitive resin, forming second thermoelectric bodies consisting of a second thermoelectric material by plating on the second electrode film inside openings of the photosensitive resin, bonding a heat insulating sheet onto the photosensitive resin, the first thermoelectric bodies, and the second thermoelectric bodies, and dissolving and removing the substrate, first electrode film, and second electrode film; and connecting a plurality of thermocouples in series as a thermoelectric power generation element by a process comprising the steps of:

stacking and bonding together a plurality of the thermoelectric structures, cutting the plurality of the thermoelectric structures bonded together in a predetermined length, and connecting the surface at the cut end of each of the first thermoelectric bodies to the surface at the cut end of one of the second thermoelectric bodies, adjacent to the former, alternately by wiring electrodes.

9. A method of manufacturing a thermoelectric power generation unit, the method comprising:

a composite thermoelectric structure forming process comprising steps of:

forming a metallic film on a substrate whose surface or whole body has insulation properties, forming the metallic film by etching into a first electrode film and a second electrode film, formed in the shape of teeth of two combs facing each other, each tooth being alternately interposed between adjacent teeth, forming a pattern in the shape of stripes in the gap area between the first electrode film and the second electrode film, each in the shape of teeth of a comb, using a photosensitive resin, forming first thermoelectric bodies consisting of a first thermoelectric material by plating on the first electrode film inside openings of the photosensitive resin, forming second thermoelectric bodies consisting of a second thermoelectric material by plating on the second electrode film inside openings of the photosensitive resin, bonding together two substrates on which respectively the first thermoelectric bodies and the second thermoelectric bodies are formed in the foregoing steps of processing, via a heat insulating sheet interposed therebetween, and dissolving and removing each of the substrates, the first electrode film, and the second electrode film; and connecting a plurality of thermocouples in series as a thermoelectric power generation element by a process comprising the steps of:

bonding together a plurality of the composite thermoelectric structures laid in layers, cutting the composite thermoelectric structures bonded together in a predetermined length, and connecting the surface at the cut end of each of the first thermoelectric bodies to the surface at the cut end of one of the second thermoelectric bodies, adjacent to the former, alternately with wiring electrodes.

10. A method of manufacturing a thermoelectric power generation unit, the method comprising:

a thermoelectric structure forming process comprising steps of:

forming a metallic film on a substrate whose surface or whole body has insulation properties, forming the metallic film by etching into a first electrode film and a second electrode film, formed in the shape of teeth of two combs facing each other, each tooth being alternately interposed between adjacent teeth, forming a pattern in the shape of stripes in the gap area between the first electrode film and the second electrode film, each in the shape of teeth of a comb, using a photosensitive resin, forming first thermoelectric bodies consisting of a first thermoelectric material by plating on the first electrode film inside openings of the photosensitive resin, forming second thermoelectric bodies consisting of a second thermoelectric material by plating on the second electrode film inside openings of the photosensitive resin, coating the photosensitive resin, the first thermoelectric bodies, and the second thermoelectric bodies with a thermosetting resin, forming another metallic film on an entire plating initiation surface after dissolving and removing the substrates, first electrode films, and second electrode films, and forming thermocouples in a row as a thermoelectric power generation element after connecting each of the first thermoelectric bodies to one of the second thermoelectric bodies, adjacent to the former, alternately with wiring electrodes formed by patterning the metallic film by the etching method; and connecting all of the thermocouples in series by a process comprising the steps of:

stacking and bonding together a plurality of the thermoelectric structures, and connecting together adjacent thermocouples in respective rows, end to end.

11. A method of manufacturing a thermoelectric power generation unit, the method comprising:

a thermoelectric structure forming process comprising steps of:

forming a metallic film on a substrate whose surface or whole body has insulation properties, forming the metallic film by etching into a first electrode film and a second electrode film, formed in the shape of teeth of two combs facing each other, each tooth being alternately interposed between adjacent teeth, forming a pattern in the shape of stripes in the gap area between the first electrode film and the second electrode film, each in the shape of teeth of a comb, using a photosensitive resin, forming first thermoelectric bodies consisting of a first thermoelectric material by plating on the first electrode film inside openings of the photosensitive resin, forming second thermoelectric bodies consisting of a second thermoelectric material by plating on the second electrode film inside openings of the photosensitive resin, bonding a heat insulating sheet onto the photosensitive resin, the first thermoelectric bodies, and the second thermoelectric bodies, forming another metallic film on an entire plating initiation surface after dissolving and removing the substrates, first electrode films, and second electrode films, and forming thermocouples in a row as a thermoelectric power generation element after connecting each of the first thermoelectric bodies to one of the second thermoelectric bodies, adjacent to the former, alternately with wiring electrodes formed by patterning the metallic film by the etching method; and connecting all of the thermocouples in series by a process comprising the steps of:
stacking and bonding together a plurality of the thermoelectric structures, and
connecting together adjacent thermocouples in respective rows, end to end.

12. A method of manufacturing a thermoelectric power generation unit, the method comprising:
a thermoelectric structure forming process comprising steps of:
forming a metallic film on a substrate whose surface or whole body has insulation properties,
forming the metallic film by etching into a first electrode film and a second electrode film, formed in the shape of teeth of two combs facing each other, each tooth being alternately interposed between adjacent teeth,
forming a pattern in the shape of stripes in the gap area between the first electrode film and the second electrode film, each in the shape of teeth of a comb, using a photosensitive resin,
forming first thermoelectric bodies consisting of a first thermoelectric material by plating on the first electrode film inside openings of the photosensitive resin,
forming second thermoelectric bodies consisting of a second thermoelectric material by plating on the second electrode film inside openings of the photosensitive resin,
bonding together two substrates on which respectively the first thermoelectric bodies and the second thermoelectric bodies are formed in the foregoing steps of processing, via a heat insulating sheet interposed therebetween,
forming another metallic film on an entire plating initiation surface after dissolving and removing the substrates, first electrode films, and second electrode films, and
forming thermocouples in a row as a thermoelectric power generation element after connecting each of the first thermoelectric bodies to one of the second thermoelectric bodies, adjacent to the former, alternately with wiring electrodes formed by patterning the metallic film by the etching method; and connecting all of the thermocouples in series by a process comprising the steps of:
stacking and bonding together a plurality of the thermoelectric structures, and
connecting together adjacent thermocouples in respective rows, end to end.

13. A method of manufacturing a thermoelectric power generation unit, the method comprising:
a first thermoelectric structure forming process comprising steps of:
forming an electrode film consisting of a metallic material on a substrate,
forming a photosensitive resin having a first pattern in the shape of stripes on the electrode film, and
forming first thermoelectric bodies consisting of a first thermoelectric material by plating within openings of the photosensitive resin using the electrode film such that the thickness of the first thermoelectric bodies is less than that of the photosensitive resin;
a second thermoelectric structure forming process comprising steps of:

forming an electrode film consisting of a metallic material on a substrate other than aforesaid substrate,
forming on the electrode film a photosensitive resin having a second pattern in the shape of stripes, formed at the same pitch as that of the first pattern in the shape of stripes, and provided with unopened surface areas, each narrower than the width of each of the openings in the first pattern in the shape of stripes, and openings, each wider than the width of each of the unopened surface areas un the first pattern in the shape of stripes, and
forming second thermoelectric bodies consisting of a second thermoelectric material by plating within openings of the photosensitive resin using the electrode film such that the thickness of the second thermoelectric bodies is less than that of the photosensitive resin;
a composite thermoelectric structure forming process comprising steps of:
bonding together the first thermoelectric structure and the second thermoelectric structure formed by the aforesaid steps of processes after fitting the openings in the photosensitive resin of one of the thermoelectric structures into the unopened surface areas in the photosensitive resin of the other,
cutting the first thermoelectric structure and second thermoelectric structure bonded together as above, in a predetermined size,
dissolving and removing each of the substrates and the electrode films, and
forming thermocouples in a row as a thermoelectric element by connecting the surface at the cut end of each of the first thermoelectric bodies to the surface at the cut end of one of the second thermoelectric bodies, adjacent to the former, alternately with wiring electrodes; and connecting all of the thermocouples in series by a process comprising the steps of:
stacking and bonding together a plurality of the composite thermoelectric structures with insulators interposed therebetween, and
connecting together adjacent thermoelectric bodies on the edge of respective composite thermoelectric structures with element terminal wirings.

14. A method of manufacturing a thermoelectric power generation unit, the method comprising:
a first thermoelectric structure forming process comprising steps of:
forming a photosensitive resin having a first pattern in the shape of stripes on an electrode film formed on an electrically conductive substrate, and
forming first thermoelectric bodies consisting of a first thermoelectric material by plating inside openings of the photosensitive resin, using the electrode film, such that the thickness of the first thermoelectric bodies is less than the thickness of the photosensitive resin;
a second thermoelectric structure forming process comprising steps of:
forming an electrode film consisting of a metallic material on a substrate other than aforesaid substrate,
forming on the electrode film a photosensitive resin having a second pattern in the shape of stripes, formed at the same pitch as that of the first pattern in the shape of stripes and provided with unopened surface areas, each narrower than the width of each of the openings in the first pattern in the shape of stripes, and openings, each wider than the width of each of the unopened surface areas in the first pattern in the shape of stripes, and forming second thermoelectric bodies consisting of a second thermoelectric material by plating inside openings of the photosensitive resin, using the electrode film, such that the thickness of the second thermoelectric bodies is less than the thickness of the photosensitive resin;

a composite thermoelectric structure forming process comprising steps of:

bonding together the first thermoelectric structure and second thermoelectric structure formed by the aforesaid steps of processing after fitting the openings in the photosensitive resin of one of the thermoelectric structures into the unopened surface areas in the photosensitive resin of the other, cutting the first thermoelectric structure and second thermoelectric structure bonded together in a predetermined size, dissolving and removing each of the substrates and the electrode films, and forming thermocouples in a row as a thermoelectric element by connecting the surface at the cut end of each of the first thermoelectric bodies to the surface at the cut end of one of the second thermoelectric bodies, adjacent to the former, alternately with wiring electrodes; and connecting all of the thermocouples in series by a process comprising steps of:

stacking and bonding together a plurality of the composite thermoelectric structures with insulators interposed therebetween, and connecting together adjacent thermoelectric bodies on the edge of respective composite thermoelectric structures with element terminal wirings.

* * * * *